(12) United States Patent
Seo

(10) Patent No.: US 12,396,178 B2
(45) Date of Patent: Aug. 19, 2025

(54) SEMICONDUCTOR DEVICE AND METHOD FOR FABRICATING THE SAME

(71) Applicant: SK hynix Inc., Icheon-si (KR)

(72) Inventor: Soo Man Seo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 372 days.

(21) Appl. No.: 17/891,918

(22) Filed: Aug. 19, 2022

(65) Prior Publication Data

US 2023/0134429 A1 May 4, 2023

(30) Foreign Application Priority Data

Oct. 28, 2021 (KR) .................. 10-2021-0145480

(51) Int. Cl.
*H10B 63/00* (2023.01)
*H10B 53/30* (2023.01)
*H10B 61/00* (2023.01)

(52) U.S. Cl.
CPC ............ *H10B 63/20* (2023.02); *H10B 53/30* (2023.02); *H10B 61/10* (2023.02); *H10B 63/80* (2023.02)

(58) Field of Classification Search
CPC ........ H10B 63/20; H10B 61/10; H10B 53/30; H10B 63/80
See application file for complete search history.

(56) References Cited

U.S. PATENT DOCUMENTS

| 9,177,916 | B1 | 11/2015 | Barabash et al. |
| 9,425,237 | B2 | 8/2016 | Jo |
| 9,960,350 | B2 | 5/2018 | Ha |
| 10,910,552 | B2 | 2/2021 | Lee et al. |
| 2016/0308127 | A1 | 10/2016 | Kim et al. |
| 2017/0053965 | A1 | 2/2017 | Baek et al. |
| 2017/0092851 | A1 | 3/2017 | Han et al. |
| 2019/0051700 | A1 | 2/2019 | Kim |
| 2019/0214554 | A1 | 7/2019 | Li et al. |
| 2020/0006428 | A1* | 1/2020 | Jiang .................. G11C 13/0026 |
| 2020/0006643 | A1 | 1/2020 | Gosavi et al. |
| 2020/0161372 | A1 | 5/2020 | Beckmann et al. |
| 2023/0131200 | A1* | 4/2023 | Ha .......................... H10N 70/25 257/4 |

OTHER PUBLICATIONS

Christophe Lacuyer; David C. Brock; Jay Last, "Appendix," in Makers of the Microchip: A Documentary History of Fairchild Semiconductor, MIT Press, 2010 (Year: 2010).

* cited by examiner

*Primary Examiner* — Richard A Booth
(74) *Attorney, Agent, or Firm* — Perkins Coie LLP

(57) ABSTRACT

A semiconductor device may include: a plurality of first conductive lines; a plurality of second conductive lines disposed over the first conductive lines to be spaced apart from the first conductive line, a variable resistance layer disposed above the first conductive line and below the second conductive line; at least one of a first interlayer dielectric layer or a second interlayer dielectric layer; at least one of a first contact or a second contact, wherein the first selector layer is disposed in a portion of the first interlayer dielectric layer below the first contact and the second selector layer is disposed in a portion of the second dielectric layer below the second contact, wherein the first selector layer includes a dielectric material of the first interlayer dielectric layer and a dopant, and the second selector layer includes a dielectric material of the second interlayer dielectric layer and a dopant.

41 Claims, 34 Drawing Sheets

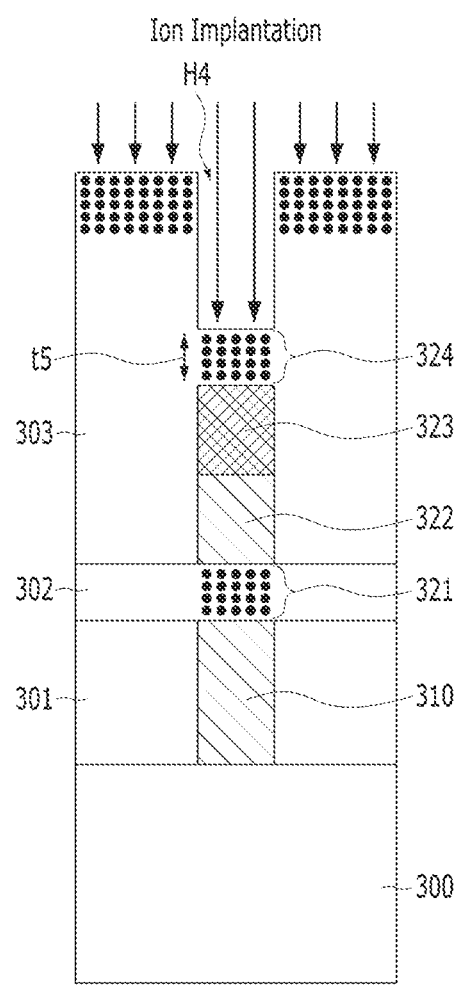

SEMICONDUCTOR DEVICE AND METHOD FOR FABRICATING THE SAME

PRIORITY CLAIM AND CROSS-REFERENCE TO RELATED APPLICATION

This patent document claims the priority and benefits of Korean Patent Application No. 10-2021-0145480 filed on Oct. 28, 2021, which is incorporated herein by reference in its entirety.

TECHNICAL FIELD

This patent document relates to memory circuits or devices and their applications in electronic devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document includes memory circuits or devices and their applications in electronic devices or systems and various implementations of an electronic device that can improve the performance of a semiconductor device and reduce manufacturing defects.

In one aspect, a semiconductor device may include: a plurality of first conductive lines; a plurality of second conductive lines disposed over the first conductive lines to be spaced apart from the first conductive line, a variable resistance layer disposed above the first conductive line and below the second conductive line; at least one of a first interlayer dielectric layer or a second interlayer dielectric layer, wherein the first interlayer dielectric layer includes a first hole disposed between the first conductive line and the variable resistance layer and the second interlayer dielectric layer includes a second hole disposed between the variable resistance layer and the second conductive line; at least one of a first contact or a second contact, wherein the first contact is disposed in the first hole and the second contact is disposed in the second hole; and at least one of a first selector layer or a second selector layer, wherein the first selector layer is disposed in a portion of the first interlayer dielectric layer below the first contact and the second selector layer is disposed in a portion of the second dielectric layer below the second contact, wherein the first selector layer includes a dielectric material of the first interlayer dielectric layer and a dopant, and the second selector layer includes a dielectric material of the second interlayer dielectric layer and a dopant.

In another aspect, a semiconductor device may include: a plurality of first conductive lines; a plurality of second conductive lines disposed over the first conductive lines to be spaced apart from the first conductive lines; a variable resistance layer disposed above the first conductive line and below the second conductive line; at least one of a first interlayer dielectric layer or a second interlayer dielectric layer, wherein the first interlayer dielectric layer surrounds sidewalls of the first conductive line and the second interlayer dielectric layer surrounds sidewalls of the variable resistance layer; and at least one of a first selector layer or a second selector layer, wherein the first selector layer is disposed above the first conductive line and the first interlayer dielectric layer and below the variable resistance layer and the second interlayer dielectric layer, and the second selector layer is disposed selector layer above the variable resistance layer and the second interlayer dielectric layer and below the second conductive line.

In another aspect, a semiconductor device may include: a first conductive line; a second conductive line disposed over the first conductive line to be spaced apart from the first conductive line; a variable resistance layer disposed above the first conductive line and below the second conductive line; a first selector layer disposed between the first conductive line and the variable resistance layer; and a second selector layer disposed between the variable resistance layer and the second conductive line, wherein each of the first selector layer and the second selector layer includes a dielectric material and a dopant.

In another aspect, a method for fabricating a semiconductor device may include: forming a first conductive line over a substrate; forming a second conductive line over the first conductive line to be spaced apart from the first conductive line; forming a variable resistance layer above the first conductive line and below the second conductive line; forming an interlayer dielectric layer including a hole between the first conductive line and the variable resistance layer, between the variable resistance layer and the second conductive line, or both between the first conductive line and the variable resistance layer and between the variable resistance layer and the second conductive line; and performing an ion implantation of a dopant into a portion of the interlayer dielectric layer below the hole and upper portions of the interlayer dielectric layer on both sides of the hole to convert the portion of the interlayer dielectric layer below the hole into a selector layer.

In another aspect, a method for fabricating a semiconductor device may include: forming a first conductive line over a substrate; forming a second conductive line over the first conductive line to be spaced apart from the first conductive line; forming a variable resistance layer between the first conductive line and the second conductive line; forming at least one of a first interlayer dielectric layer or a second interlayer dielectric layer, wherein the first interlayer dielectric layer surrounds sidewalls of the first conductive line and the second interlayer dielectric layer surrounds sidewalls of the variable resistance layer; forming at least one of a first dielectric layer or a second dielectric layer, wherein the first dielectric layer is disposed above the first conductive line and the first interlayer dielectric layer and below the variable resistance layer and the second interlayer dielectric layer, and the second dielectric layer is disposed above the variable resistance layer and the second interlayer dielectric layer and below the second conductive line; and performing an ion implantation process on at least one of the first dielectric layer or the second dielectric layer to form at least one of a first selector layer or a second selector layer, wherein the first selector layer is disposed above the first conductive line and the first interlayer dielectric layer and below the variable resistance layer and the second interlayer dielectric layer and the second selector layer is disposed above the variable resistance layer and the second interlayer dielectric layer and below the second conductive line, and the first selector layer and the second selector layer include a dielectric material and a dopant, respectively.

BRIEF DESCRIPTION OF THE DRAWINGS

FIGS. 3A to 3I are cross-sectional views illustrating another example method for fabricating a semiconductor device based on some implementations of the disclosed technology.

DETAILED DESCRIPTION

Hereinafter, various embodiments of the disclosure will be described in detail with reference to the accompanying drawings.

Figure 1A:
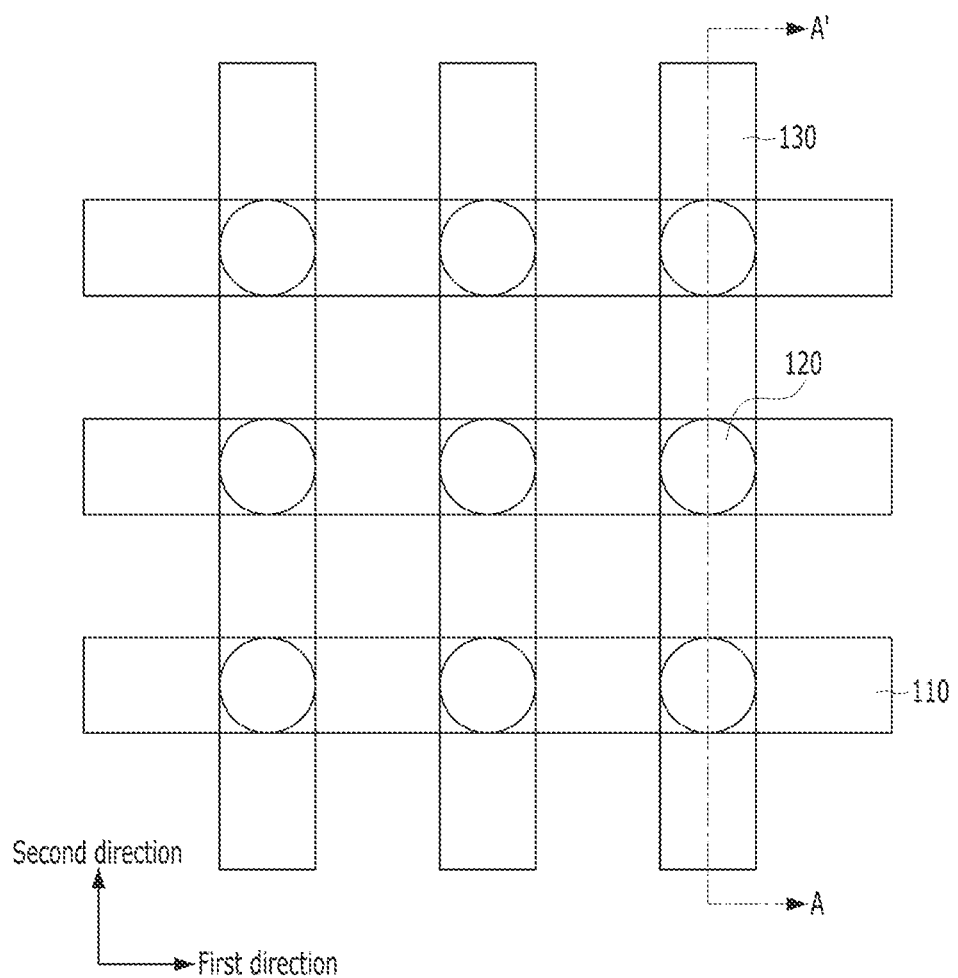
FIGS. 1A and 1B illustrate a semiconductor device based on some implementations of the disclosed technology.
Figure 1B:
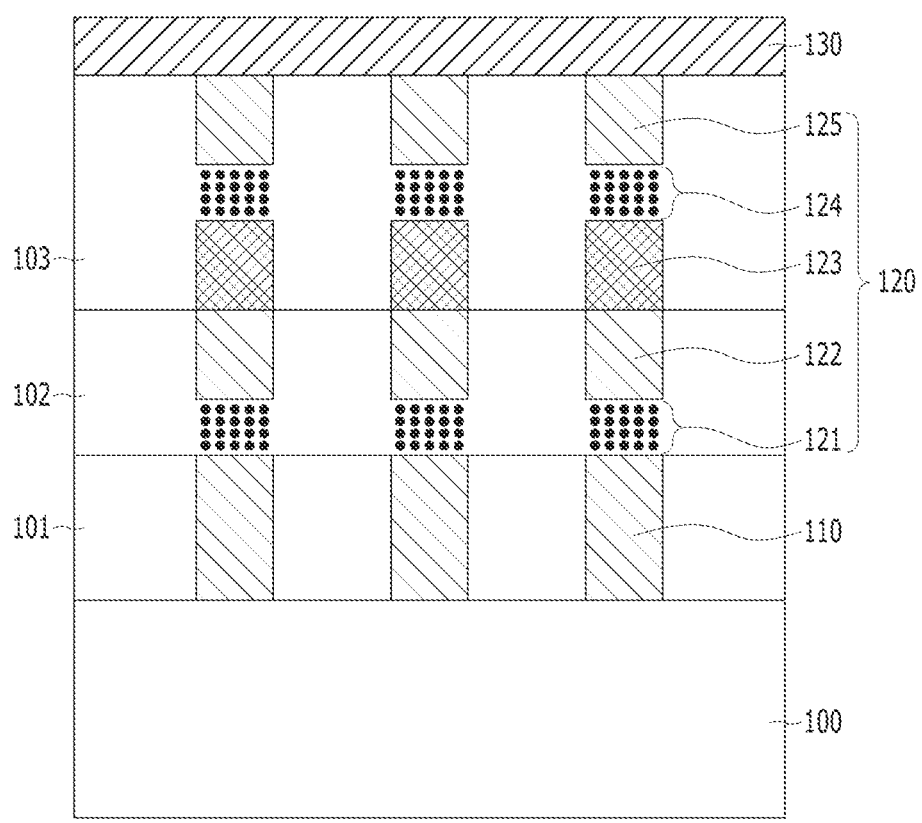

FIGS. 1A and 1B illustrate a semiconductor device based on some implementations of the disclosed technology. FIG. 1A is a plan view, and FIG. 1B is a cross-sectional view taken along line A-A' of FIG. 1A.

Referring to FIGS. 1A and 1B, the semiconductor device may include a cross-point structure including a substrate 100, first conductive lines 110 formed over the substrate 100 and extending in a first direction, second conductive lines 130 formed over the first conductive lines 110 to be spaced apart from the first conductive lines 110 and extending in a second direction crossing the first direction, and memory cells 120 disposed at intersections of the first conductive lines 110 and the second conductive lines 130 between the first conductive lines 110 and the second conductive lines 130.

The substrate 100 may include a semiconductor material such as silicon. A required lower structure (not shown) may be formed in the substrate 100. For example, the substrate 100 may include a driving circuit (not shown) electrically connected to the first conductive lines 110 and/or the second conductive lines 130 to control operations of the memory cells 120. In this patent document, the conductive lines can indicate conductive structures that electrically connect two or more circuit elements in the semiconductor device. In some implementations, the conductive lines include word lines that are used control access to memory cells in the memory device and bit lines that are used to read out information stored in the memory cells. In some implementations, the conductive lines include interconnects that carry signals between different circuit elements in the semiconductor device.

The first conductive line 110 and the second conductive line 130 may be connected to a lower end and an upper end of the memory cell 120, respectively, and may provide a voltage or a current to the memory cell 120 to drive the memory cell 120. When the first conductive line 110 functions as a word line, the second conductive line 130 may function as a bit line. Conversely, when the first conductive line 110 functions as a bit line, the second conductive line 130 may function as a word line. The first conductive line 110 and the second conductive line 130 may include a single-layer or multilayer structure including one or more of various conductive materials. Examples of the conductive materials may include a metal, a metal nitride, or a conductive carbon material, or a combination thereof, but are not limited thereto. For example, the first conductive line 110 and the second conductive line 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix having rows and columns along the first direction and the second direction so as to overlap the intersection regions between the first conductive lines 110 and the second conductive lines 130. In an implementation, each of the memory cells 120 may have a size that is substantially equal to or smaller than that of the intersection region between each corresponding pair of the first conductive lines 110 and the second conductive lines 130. In another implementation, each of the memory cells 120 may have a size that is larger than that of the intersection region between each corresponding pair of the first conductive lines 110 and the second conductive lines 130.

Spaces between the first conductive line 110, the second conductive line 130 and the memory cell 120 may be filled with a dielectric material.

The memory cell 120 may include a stacked structure including a first selector layer 121, a first contact 122, a variable resistance layer 123, a second selector layer 124 and a second contact 125.

The first contact 122 may be disposed between the first selector layer 121 and the variable resistance layer 123. The first contact 122 may function as a middle electrode to electrically connect the first selector layer 121 and the variable resistance layer 123 to each other while physically separating the first selector layer 121 and the variable resistance layer 123 from each other.

The second contact 125 may be disposed at an uppermost portion of the memory cell 120 and function as a transmission path of a voltage or a current between the rest of the memory cell 120 and a corresponding one of the second conductive lines 130.

The first contact 122 and the second contact 125 may include a single-layer or multilayer structure including various conductive materials such as a metal, a metal nitride, a conductive carbon material, or a combination thereof, respectively. For example, the first contact 122 and the second contact 125 may include tungsten (W), titanium (Ti), tantalum (Ta), platinum (Pt), aluminum (Al), copper (Cu), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The first contact 122 and the second contact 125 may include the same material as each other or different materials from each other.

The first contact 122 and the second contact 125 may have the same thickness as each other or different thicknesses from each other.

The variable resistance layer 123 may be used to store data by switching between different resistance states according to an applied voltage or current. The variable resistance layer 123 may have a single-layered structure or a multi-layered structure including at least one of materials used for an RRAM, a PRAM, an MRAM, an FRAM, and others. For example, the variable resistance layer 123 may include a metal oxide such as a transition metal oxide or a perovskite-based oxide, a phase change material such as a chalcogenide-based material, a ferromagnetic material, a ferroelectric material, or others. However, the implementations are not limited thereto, and the memory cell 120 may include other memory layers capable of storing data in various ways instead of the variable resistance layer 123.

In some implementations, the variable resistance layer 123 may include a magnetic tunnel junction (MTJ) structure. This will be explained with reference to FIG. 1C.

Figure 1C:
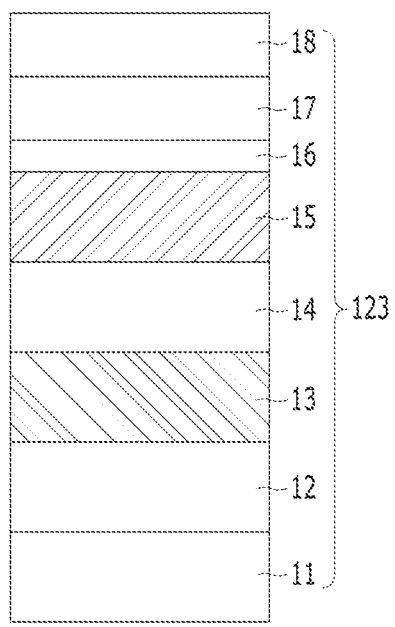
FIG. 1C illustrates an example of Magnetic Tunnel Junction (MTJ) structure included in a variable resistance layer based on some implementations of the disclosed technology.

FIG. 1C illustrates an example of Magnetic Tunnel Junction (MTJ) structure included in the variable resistance layer 123.

The variable resistance layer 123 may include an MTJ structure including a free layer 13 having a variable magnetization direction, a pinned layer 15 having a pinned magnetization direction and a tunnel barrier layer 14 interposed between the free layer 13 and the pinned layer 15.

The free layer 13 may have one of different magnetization directions or one of different spin directions of electrons to switch the polarity of the free layer 13 in the MTJ structure, resulting in changes in resistance value. In some implementations, the polarity of the free layer 13 is changed or flipped upon application of a voltage or current signal (e.g., a driving current above a certain threshold) to the MTJ structure. With the polarity changes of the free layer 13, the free layer 13 and the pinned layer 15 have different magnetization directions or different spin directions of electron, which allows the variable resistance layer 123 to store different data or represent different data bits. The free layer 13 may also be referred as a storage layer. The magnetization direction of the free layer 13 may be substantially perpendicular to a surface of the free layer 13, the tunnel barrier layer 14 and the pinned layer 15. In other words, the magnetization direction of the free layer 13 may be substantially parallel to stacking directions of the free layer 13, the tunnel barrier layer 14 and the pinned layer 15. Therefore, the magnetization direction of the free layer 13 may be changed between a downward direction and an upward direction. The change in the magnetization direction of the free layer 13 may be induced by a spin transfer torque generated by an applied current or voltage.

The free layer 13 may have a single-layer or multilayer structure including a ferromagnetic material. For example, the free layer 13 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd or others.

The tunnel barrier layer 14 may allow the tunneling of electrons in both data reading and data writing operations. In a write operation for storing new data, a high write current may be directed through the tunnel barrier layer 14 to change the magnetization direction of the free layer 13 and thus to change the resistance state of the MTJ for writing a new data bit. In a reading operation, a low reading current may be directed through the tunnel barrier layer 14 without changing the magnetization direction of the free layer 13 to measure the existing resistance state of the MTJ under the existing magnetization direction of the free layer 13 to read the stored data bit in the MTJ. The tunnel barrier layer 14 may include a dielectric oxide such as MgO, CaO, SrO, TiO, VO, or NbO or others.

The pinned layer 15 may have a pinned magnetization direction, which remains unchanged while the magnetization direction of the free layer 13 changes. The pinned layer 15 may be referred to as a reference layer. In some implementations, the magnetization direction of the pinned layer 15 may be pinned in a downward direction. In some implementations, the magnetization direction of the pinned layer 15 may be pinned in an upward direction.

The pinned layer 15 may have a single-layer or multilayer structure including a ferromagnetic material. For example, the pinned layer 15 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or may include a stack of metals, such as Co/Pt, or Co/Pd or others.

If a voltage or current is applied to the variable resistance layer 123, the magnetization direction of the free layer 13 may be changed by spin torque transfer. In some implementations, when the magnetization directions of the free layer 13 and the pinned layer 15 are parallel to each other, the variable resistance layer 123 may be in a low resistance state, and this may indicate digital data bit "0." Conversely, when the magnetization directions of the free layer 13 and the pinned layer 15 are anti-parallel to each other, the variable resistance layer 123 may be in a high resistance state, and this may indicate a digital data bit "1." In some implementations, the variable resistance layer 123 can be configured to store data bit '1' when the magnetization directions of the free layer 13 and the pinned layer 15 are parallel to each other and to store data bit '0' when the magnetization directions of the free layer 13 and the pinned layer 15 are anti-parallel to each other.

In some implementations, the variable resistance layer 123 may further include one or more layers performing various functions to improve a characteristic of the MTJ structure. For example, the variable resistance layer 123 may further include at least one of a buffer layer 11, an under layer 12, a spacer layer 16, a magnetic correction layer 17 and a capping layer 18.

The under layer 12 may be disposed under the free layer 13 and serve to improve perpendicular magnetic crystalline anisotropy of the free layer 13. The under layer 12 may have a single-layer or multilayer structure including a metal, a metal alloy, a metal nitride, or a metal oxide, or a combination thereof.

The buffer layer 11 may be disposed below the under layer 12 to facilitate crystal growth of the under layer 12, thus improving perpendicular magnetic crystalline anisotropy of the free layer 13. The buffer layer 11 may have a single-layer or multilayer structure including a metal, a metal alloy, a metal nitride, or a metal oxide, or a combination thereof. Moreover, the buffer layer 11 may be formed of or include a material having a good compatibility with a bottom electrode (not shown) in order to resolve the lattice constant mismatch between the bottom electrode and the under layer 12. For example, the buffer layer 11 may include tantalum (Ta).

The spacer layer 16 may be interposed between the magnetic correction layer 17 and the pinned layer 15 and function as a buffer between the magnetic correction layer 17 and the pinned layer 15. The spacer layer 16 may be used to improve characteristics of the magnetic correction layer 17. The spacer layer 16 may include a noble metal such as ruthenium (Ru).

The magnetic correction layer 17 may be used to offset the effect of the stray magnetic field produced by the pinned layer 15. In this case, the effect of the stray magnetic field of the pinned layer 15 can decrease, and thus a biased magnetic field in the free layer 13 can decrease. The magnetic correction layer 17 may have a magnetization direction anti-parallel to the magnetization direction of the pinned layer 15. In the implementation, when the pinned layer 15 has a downward magnetization direction, the magnetic correction layer 17 may have an upward magnetization direction. Conversely, when the pinned layer 15 has an upward magnetization direction, the magnetic correction layer 17 may have a downward magnetization direction. The magnetic correction layer 17 may be exchange coupled with the pinned layer 15 via the spacer layer 16 to form a synthetic anti-ferromagnet (SAF) structure. The magnetic correction layer 17 may have a single-layer or multilayer structure including a ferromagnetic material.

In this implementation, the magnetic correction layer 17 is located above the pinned layer 15, but the magnetic correction layer 17 may disposed at a different location. For example, the magnetic correction layer 17 may be located above, below, or next to the MTJ structure while the magnetic correction layer 17 is patterned separately from the MTJ structure.

The capping layer 18 may be used to protect the variable resistance layer 123 and/or function as a hard mask for patterning the variable resistance layer 123. In some implementations, the capping layer 18 may include various conductive materials such as a metal. In some implementations, the capping layer 18 may include a metallic material having almost none or a small number of pin holes and high resistance to wet and/or dry etching. In some implementations, the capping layer 18 may include a metal, a nitride, or an oxide, or a combination thereof. For example, the capping layer 18 may include a noble metal such as ruthenium (Ru).

The capping layer 18 may have a single-layer or multilayer structure. In some implementations, the capping layer 18 may have a multilayer structure including an oxide, or a metal, or a combination thereof. For example, the capping layer 18 may have a multilayer structure of an oxide layer, a first metal layer and a second metal layer.

A material layer (not shown) for resolving the lattice structure differences and the lattice constant mismatch between the pinned layer 15 and the magnetic correction layer 17 may be interposed between the pinned layer 15 and the magnetic correction layer 17. For example, this material layer may be amorphous and may include a metal a metal nitride, or metal oxide.

The first and the second selector layers 121 and 124 may be used to control access to the variable resistance layer 123. To this end, the first and the second selector layers 121 and 124 may be used to adjust the flow of a current according to the magnitude of the applied a voltage or a current, that is, for blocking or substantially limiting a current flowing through the memory cell 120 when a magnitude of an applied voltage is less than a predetermined threshold value and for allowing a current flowing through the memory cell 120 to abruptly increase when the magnitude of the applied voltage is equal to or greater than the threshold value. The first and the second selector layers 121 and 124 may include an MIT (Metal Insulator Transition) material such as $NbO_2$, $TiO_2$, $VO_2$, $WO_2$, or others, an MIEC (Mixed Ion-Electron Conducting) material such as $ZrO_2(Y_2O_3)$, $Bi_2O_3$—BaO, $(La_2O_3)_x(CeO_2)_{1-x}$, or others, an OTS (Ovonic Threshold Switching) material including a chalcogenide material such as $Ge_2Sb_2Te_5$, $As_2Te_3$, $As_2$, $As_2Se_3$, or others, or a tunneling insulating material such as silicon oxide, silicon nitride, a metal oxide, or others. A thickness of the tunneling insulating layer is sufficiently small to allow tunneling of electrons under a given voltage or a given current. The first and the second selector layers 121 and 124 may include a single-layer or multilayer structure. In various implementations, the first and the second selector layers 121 and 124 may be a blanket-doped layer at a region which is doped uniformly within that region without using any mask or pattern within that doped region.

In one implementation, the first and the second selector layers 121 and 124 may be configured to perform a threshold switching operation for turning on or off the conduction of an electric current through the first and the second selector layers 121 and 124 while an external voltage is being applied to the first and the second selector layers 121 and 124 at a voltage value with respect to a threshold voltage. The absolute value of the external voltage may be controlled to gradually increase or decrease. When the absolute value of the external voltage applied to the first and the second selector layers 121 and 124 increases, the first and the second selector layers 121 and 124 may be turned on to be electrically conductive, when the absolute value of the external voltage is greater than a first threshold voltage, once turned on, the increase of this external voltage causes an operation current to increase nonlinearly. When the absolute value of the external voltage applied to the first and the second selector layers 121 and 124 decreases after the first and the second selector layers 121 and 124 are turned on, the operation current flowing through or between the first and the second blanket-doped selector layers 121 and 124 decreases nonlinearly until the applied voltage value reaches a second threshold voltage below which the first and the second selector layers 121 and 124 may be turned off (i.e., electrically non-conductive). As such, the first and the second selector layers 121 and 124 performing the threshold switching operation may have a non-memory operation characteristic.

In some implementations, the first and the second selector layers 121 and 124 may include a dielectric material having incorporated dopants. The first and the second selector layers 121 and 124 may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the first and the second selector layers 121 and 124 may include an n-type dopant or a p-type dopant and be incorporated for example, by ion implantation process. Examples of the dopants may include one or more of boron (B), nitrogen (N), carbon (C), phosphorous (P), arsenic (As), aluminum (Al), silicon (Si) and germanium (Ge). For example, the first and the second selector layers 121 and 124 may include As-doped silicon oxide or Ge-doped silicon oxide.

Conventionally, the first and the second selector layers 121 and 124 including a doped dielectric material may be formed by forming a separate blanket dielectric layer for forming the first and the second selector layers 121 and 124, incorporating a dopant into the dielectric layer by an ion implantation process, and performing an etch process for patterning the first and the second selector layers 121 and 124. A separate sidewall passivation process may be required to protect other layers such as the variable resistance layer 123 during the etch process. In this case, various problems may be caused by the etch process and the passivation process. In particular, since an etch process margin for pillar formation is reduced as a pitch is decreased, it is difficult to control sidewall damage due to the etch process.

In order to overcome these problems, in implementations of the disclosed technology, the first and the second selector layers 121 and 124 may be formed by incorporating a dopant into an interlayer dielectric layer 102 remaining below a hole for forming the first contact 122 and an interlayer dielectric layer 103 remaining a hole for forming the second contact 125 by an ion implantation process, instead of forming a separate dielectric layer for forming the first and the second selector layers 121 and 124. Accordingly, since a forming process of a separate dielectric layer and a separate patterning process are not performed for forming the first and the second selector layers 121 and 124, a height of the memory cell 120 may not be increased, thereby improving the etch process margin. Also, it is possible to easily control sidewall damage generated during patterning of the first and the second selector layers 121 and 124. Moreover, a separate passivation process for protecting other layers such as the variable resistance layer 123 during the patterning process may be omitted.

Forming of the first and the second selector layers 121 and 124 may be described in detail with reference to FIGS. 2A to 2H, FIGS. 3A to 3I, FIGS. 4A to 4G, and FIGS. 5A to 5G.

In some implementations, the first and the second selector layers 121 and 124 may perform a threshold switching operation through a doped region formed in material layers for the first and the second selector layers 121 and 124. Thus, a size of the threshold switching operation region may be controlled by a distribution area of the dopants. The dopants may form trap sites for charge carriers in the material layers for the first and the second selector layers 121 and 124. The trap sites may capture the charge carriers moving in the first and the second selector layers 121 and 124, based on an external voltage applied to the first and the second selector layers 121 and 124. The trap sites thereby are used to perform a threshold switching operation.

In some implementations, each of the memory cell 120 may include the first selector layer 121, the first contact 122, the variable resistance layer 123, the second selector layer 124 and the second contact 125 which are sequentially stacked. However, the memory cells 120 may have different structures. In some implementations, at least one of the first contact 122 and the second contact 125 may be omitted. In some implementations, at least one of the first selector layer 121 and the second selector layer 124 may be omitted. In some implementations, for example, when the buffer layer 11 included in the variable resistance layer 123 may function as an electrode (e.g., middle electrode), the contact 122 may be omitted. In some implementations, in addition to the layers 121 to 125 shown in FIG. 1B, the memory cells 120 may further include one or more layers (not shown) that can be used to enhance characteristics of the memory cells 120 or reduce manufacturing defects.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (i.e., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

In some implementations, the semiconductor device may include further layers in addition to the first conductive line 110, the memory cell 120 and the second conductive line 130.

Although one cross-point structure has been described, two or more cross-point structures may be stacked in a vertical direction perpendicular to a top surface of the substrate 100.

A method for fabricating a semiconductor device will be explained with reference to FIGS. 2A to 2H.

FIGS. 2A to 2H are cross-sectional views illustrating an example method for fabricating a semiconductor device based on some implementations of the disclosed technology.

Figure 2A:
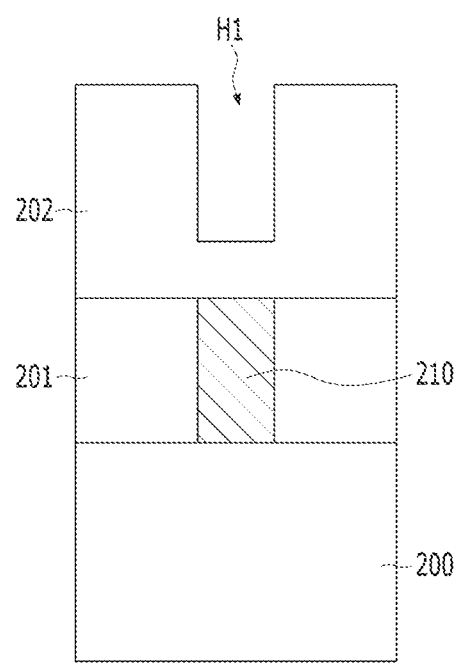
FIGS. 2A to 2H are cross-sectional views illustrating an example method for fabricating a semiconductor device based on some implementations of the disclosed technology.

Referring to FIG. 2A, first conductive lines 210 may be formed over a substrate 200 in which a predetermined structure is formed. The first conductive lines 210 may be formed by forming an interlayer dielectric layer 201 having a trench for forming the first conductive lines 210 over the substrate 200, forming a conductive layer for the first conductive lines 210, and etching the conductive layer using a mask pattern in a line shape extending in a first direction.

An interlayer dielectric layer 202 may be formed over the first conductive lines 210 and the interlayer dielectric layer 201. Then, a hole or recess H1 may be formed in the interlayer dielectric layer 202 and a portion of the interlayer dielectric layer 202 below the hole H1 may remain after the formation of the hole H1. The remaining portion of the interlayer dielectric layer 202 may have a predetermined thickness.

The hole H1 may be a space in which a first contact (e.g., 222 of FIG. 2D) is formed in a subsequent process. Accordingly, a height for the hole H1 may be adjusted in consideration of a height of the first contact 222 and a subsequent planarization process (see FIG. 2C).

The portion of the interlayer dielectric layer 202 below the hole H1 may be a portion to be converted into a first selector layer (e.g., 221 of FIG. 2B) in a subsequent process. Therefore, when forming the hole H1 in the interlayer dielectric layer 202 by an etch process, the etch process may be performed to a certain depth on the interlayer dielectric layer 202 so that a lower portion of the interlayer dielectric layer 202 may remain under the hole H1 after the etch process. The remaining lower portion of the interlayer dielectric layer 202 may have a predetermined thickness. That is, the etch process for forming the hole H1 in the interlayer dielectric layer 202 may be performed by an LD etch (low depth etch).

The interlayer dielectric layer 202 may include a dielectric material. For example, the interlayer dielectric layer 202 may include an oxide, a nitride, an oxynitride, or a combination thereof. Examples of the oxide, the nitride and/or the oxynitride may include silicon oxide, tungsten oxide, titanium oxide, vanadium oxide, chromium oxide, platinum oxide, aluminum oxide, copper oxide, zinc oxide, nickel oxide, cobalt oxide, lead oxide, manganese oxide, niobium oxide, hafnium oxide, silicon nitride, tungsten nitride, titanium nitride, vanadium nitride, chromium nitride, platinum nitride, aluminum nitride, copper nitride, zinc nitride, nickel nitride, cobalt nitride, lead nitride, manganese nitride, niobium nitride, hafnium nitride, silicon oxynitride, tungsten oxynitride, titanium oxynitride, vanadium oxynitride, chromium oxynitride, Platinum oxynitride, aluminum oxynitride, copper oxynitride, zinc oxynitride, nickel oxynitride, cobalt oxynitride, lead oxynitride, manganese oxynitride, niobium oxynitride, or hafnium oxynitride, or a combination thereof.

Figure 2B:
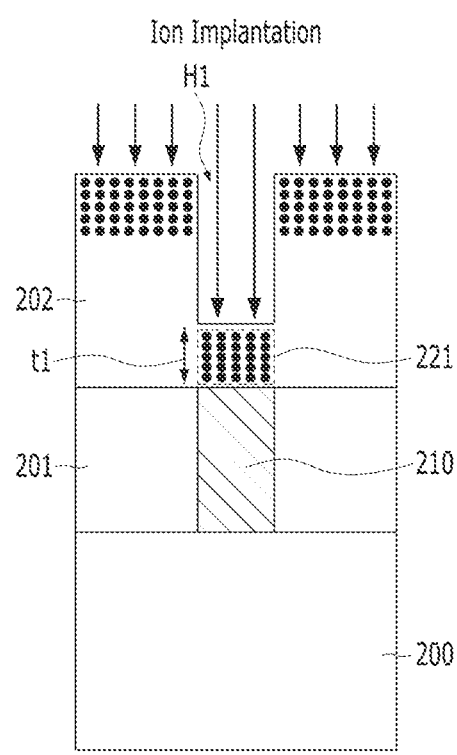

Referring to FIG. 2B, an ion implantation process may be performed on the structure of FIG. 2A. Through the ion implantation process, a dopant may be incorporated into upper portions of the interlayer dielectric layer 202 on both sides of the hole H1 and the portion of the interlayer dielectric layer 202 under the hole H1. The portion of the interlayer dielectric layer 202 under the hole H1 may be converted into the first selector layer 221 by incorporating the dopant through the ion implantation process.

The dopant incorporated by the ion implantation process may include one or more of boron (B), nitrogen (N), carbon (C), phosphorous (P), arsenic (As), aluminum (Al), silicon (Si) and germanium (Ge).

Since the first selector layer 221 may be formed without a separate patterning process, an interface between the selector layer 221 and the interlayer dielectric layer 202 may be an interface that is separated depending on the presence or absence of the dopant, not an interface that is physically separated by etching.

Figure 2C:
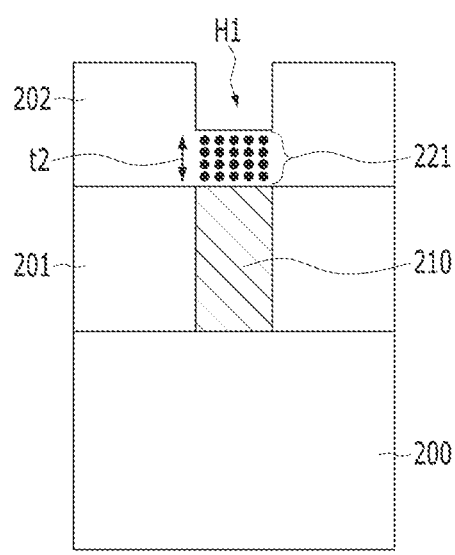

Referring to FIG. 2C, a planarization process such as a CMP (Chemical Mechanical Planarization) process may be performed to remove the doped upper portions of the interlayer dielectric layer 202 on both sides of the hole H1. In this case, a portion of the hole H1 may remain.

In some implementations, a cleaning process may be further performed before and/or after the planarization process.

A height t2 of the first selector layer 221 may be referred to as a height of the first selector layer 221 after performing of the planarization process, while a height t1 (see, FIG. 2B) of the first selector layer 221 may be referred to as a height of the first selector layer 221 before performing of the planarization process.

In some implementations, the height t2 of the first selector layer 221 may be lower than the height t1 of the first selector layer 221.

Figure 2D:
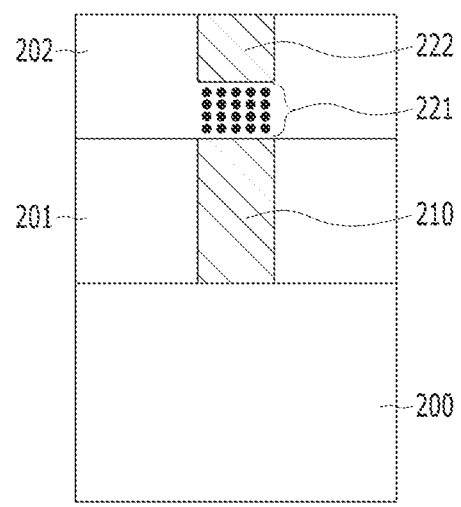

Referring to FIG. 2D, a first contact 222 may be formed in the hole H1.

The first contact 222 may be formed by forming a conductive layer for forming the first contact 222 in the hole H1 and performing a planarization process such as a CMP process. The first contact 222 may include a single-layer or multilayer structure including various conductive materials such as a metal, a metal nitride, a conductive carbon material, or a combination thereof. For example, the first contact 222 may include tungsten (W), titanium (Ti), tantalum (Ta), platinum (Pt), aluminum (Al), copper (Cu), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

Figure 2E:
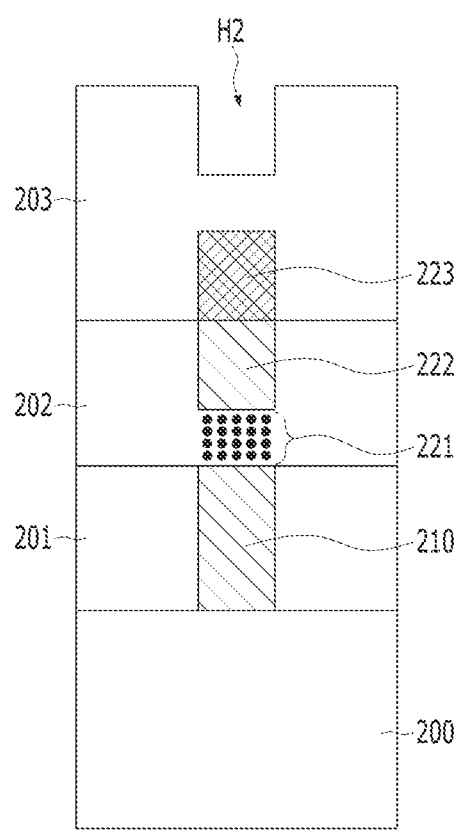

Referring to FIG. 2E, a variable resistance layer 223 may be formed on the first contact 222.

The variable resistance layer 223 may be formed by forming material layers for the variable resistance layer 223 and etching the material layers using a mask (not shown).

An interlayer dielectric layer 203 may be formed over the structure of FIG. 2D. Then, a hole H2 may be formed in the interlayer dielectric layer 203 and a portion of the interlayer dielectric layer 203 below the hole H2 may remain under the hole H2. The portion of the interlayer dielectric layer 203 may have a predetermined thickness.

The hole H2 may be a space in which a second contact (e.g., 225 of FIG. 2H) is formed in a subsequent process. The portion of the interlayer dielectric layer 203 below the hole H2 may be a portion to be converted into a second selector layer (e.g., 224 of FIG. 2H) in a subsequent process. Therefore, when forming the hole H2 in the interlayer dielectric layer 203 by an etch process, the etch process may be performed to a certain depth on the interlayer dielectric layer 203 so that a lower portion of the interlayer dielectric layer 203 may remain under the hole H2 after the etch process. The remaining lower portion of the interlayer dielectric layer 203 may have a predetermined thickness. That, the etch process for forming the hole H2 in the interlayer dielectric layer 203 may include a low depth (LD) etch process.

The interlayer dielectric layer 203 may include a dielectric material. For example, the interlayer dielectric layer 202 may include an oxide, a nitride, an oxynitride, or a combination thereof. Examples of the oxide, the nitride and/or the oxynitride may include silicon oxide, tungsten oxide, titanium oxide, vanadium oxide, chromium oxide, platinum oxide, aluminum oxide, copper oxide, zinc oxide, nickel oxide, cobalt oxide, lead oxide, manganese oxide, niobium oxide, hafnium oxide, silicon nitride, tungsten nitride, titanium nitride, vanadium nitride, chromium nitride, platinum nitride, aluminum nitride, copper nitride, zinc nitride, nickel nitride, cobalt nitride, lead nitride, manganese nitride, niobium nitride, hafnium nitride, silicon oxynitride, tungsten oxynitride, titanium oxynitride, vanadium oxynitride, chromium oxynitride, Platinum oxynitride, aluminum oxynitride, copper oxynitride, zinc oxynitride, nickel oxynitride, cobalt oxynitride, lead oxynitride, manganese oxynitride, niobium oxynitride, or hafnium oxynitride, or a combination thereof.

Figure 2F:
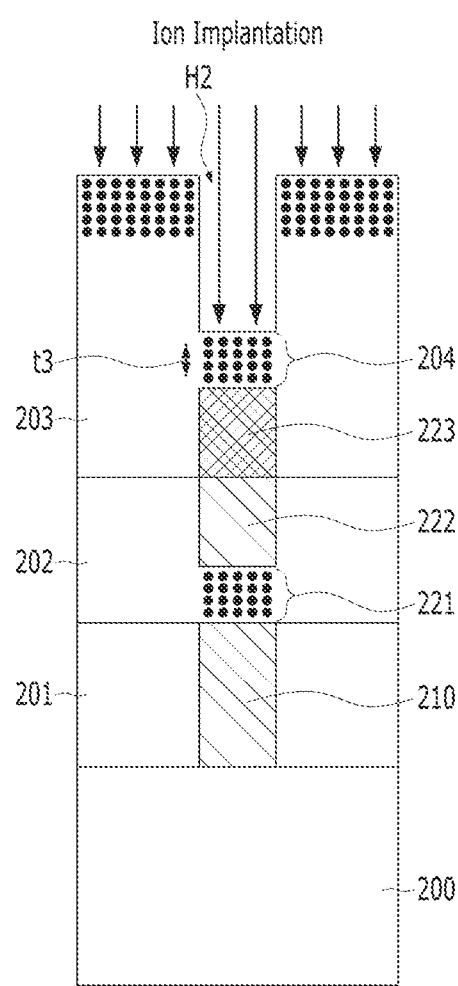

Referring to FIG. 2F, an ion implantation process may be performed on the structure of FIG. 2F. Through the ion implantation process, a dopant may be incorporated into upper portions of the interlayer dielectric layer 203 on both sides of the hole H2 and the portion of the interlayer dielectric layer 203 under the hole H2. The portion of the interlayer dielectric layer 203 under the hole H2 may be converted into a second selector layer 224 by incorporating the dopant through the ion implantation process.

The dopant incorporated by the ion implantation process may include one or more of boron (B), nitrogen (N), carbon (C), phosphorous (P), arsenic (As), aluminum (Al), silicon (Si) and germanium (Ge).

In some implementations, the second selector layer 224 and the first selector layer 221 may include the same material as each other.

Since the second selector layer 224 may be performed without a separate patterning process, an interface between the second selector layer 224 and the interlayer dielectric layer 203 may be an interface that is separated depending on the presence or absence of the dopant, not an interface that is physically separated by etching.

Figure 2G:
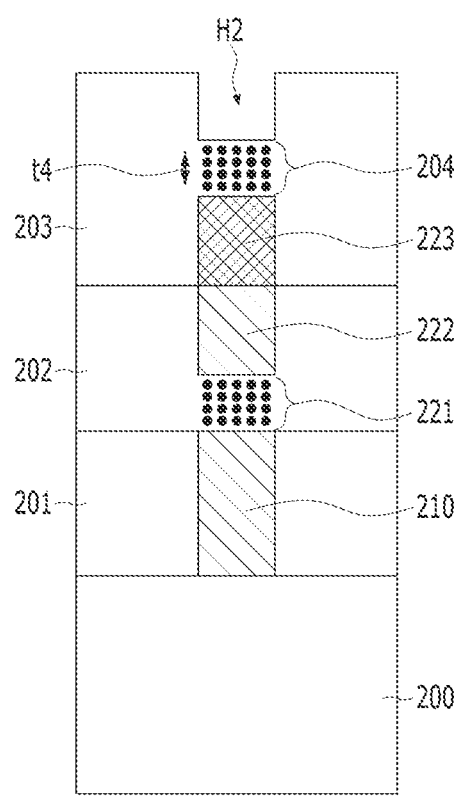

Referring to FIG. 2G, a planarization process such as a CMP (Chemical Mechanical Planarization) process may be performed to remove the doped upper portions of the interlayer dielectric layer 203 on both sides of the hole H2. In this case, a portion of the hole H2 may remain.

In some implementations, a cleaning process may be further performed before and/or after the planarization process.

A height t4 of the second selector layer 224 may be referred to as a height of the second selector layer 224 after performing of the planarization process, while a height t3 (see, FIG. 2F) of the second selector layer 224 may be referred to as a height of the second selector layer 224 before performing of the planarization process.

In some implementations, the height t4 of the second selector layer 224 may be lower than the height t3 of the second selector layer 224.

Figure 2H:
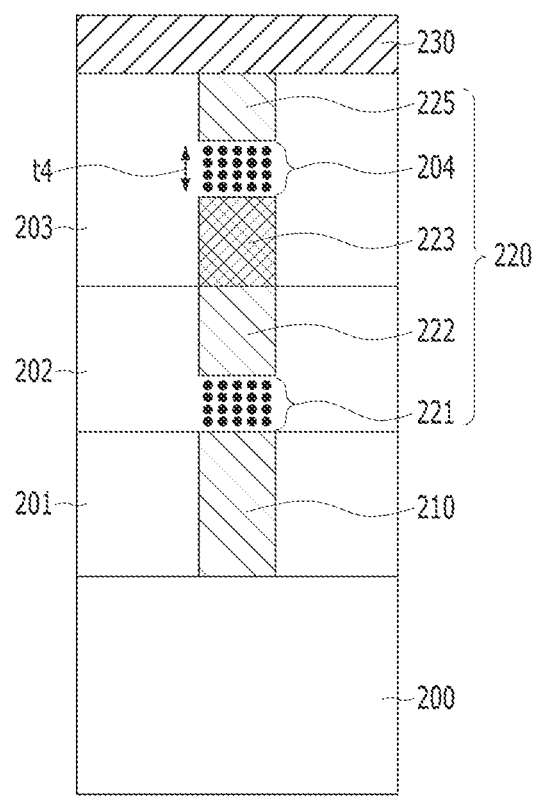

Referring to FIG. 2H, a second contact 225 may be formed in the hole H2.

The second contact 225 may be formed by forming a conductive layer for forming the second contact 225 in the hole H2 and performing a planarization process such as a CMP process. The second contact 225 may include a single-layer or multilayer structure including various conductive materials such as a metal, a metal nitride, a conductive carbon material, or a combination thereof. For example, the second contact 225 may include tungsten (W), titanium (Ti), tantalum (Ta), platinum (Pt), aluminum (Al), copper (Cu), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

Through the processes described above, a memory cell 220 including first selector layer 221, first contact 222, variable resistance layer 223, second selector layer 224 및 second contact 225 may be formed.

Second conductive lines 230 may be formed on the second contact 225 and the interlayer dielectric layer 203.

The second conductive lines 230 may be formed by forming a conductive layer for forming the second conductive lines 230 on the second contact 225 and the interlayer dielectric layer 203 and etching the conductive layer using a mask pattern in a line shape extending in a second direction.

The substrate 200, the first conductive lines 210, the first selector layer 221, the first contact 222, the variable resistance layer 223, the second selector layer 224, the second contact 225 and the second conductive lines 230 illustrated in FIG. 2H may correspond to the substrate 100, the first conductive lines 110, the first selector layer 121, the first contact 122, the variable resistance layer 123, the second selector layer 124, the second contact 125 and the second conductive lines 130 illustrated in FIG. 1B, respectively.

The semiconductor device formed by the method illustrated in FIGS. 2A to 2H may include the substrate 200, the first conductive lines 210, the memory cell 220 and the second conductive lines 230. The memory cell 220 may include the first selector layer 221, the first contact 222, the variable resistance layer 223, the second selector layer 224 and the second contact 225.

The semiconductor device may include two selector layers, that is, the first selector layer 221 and the second selector layer 224. The first selector layer 221 and the second selector layer 224 may be formed of the same material as each other and/or may have the same operation characteristic and device operation conditions as each other. In this case, a durability defect rate may be reduced arithmetically by half. Therefore, even if any one of the selector layers 221 and 224 is not operated, it is possible to preserve bit cell operation at a corresponding address.

The semiconductor device includes both the first selector layer 221 and the second selector layer 224. However, the semiconductor device may include any one of the first selector layer 221 and the second selector layer 224.

The semiconductor device includes both the first contact 222 and the second contact 225. However, the semiconductor device may include any one of the first contact 222 and the second contact 225. For example, when the buffer layer 11 included in the variable resistance layer 223 may function as a middle electrode, the first contact 222 may be omitted.

In accordance with the implementations, the first and the second selector layers 221 and 224 may be formed by incorporating the dopant into the interlayer dielectric layer 202 below the first contact 222 and the interlayer dielectric layer 203 below the second contact 225 through the ion implantation processes, instead of forming separate dielectric layers and patterning the dielectric layers. Accordingly, it is possible to prevent etch damage caused by an etch process for forming the selector layers 221 and 224. Further, a sidewall passivation process may be omitted, thereby improving process efficiency.

FIGS. 3A to 3I are cross-sectional views illustrating another example method for fabricating a semiconductor device based on some implementations of the disclosed technology.

The implementations illustrated in FIGS. 3A to 3I will be described focusing on differences from the implementations illustrated in FIGS. 2A to 2H.

Figure 3A:
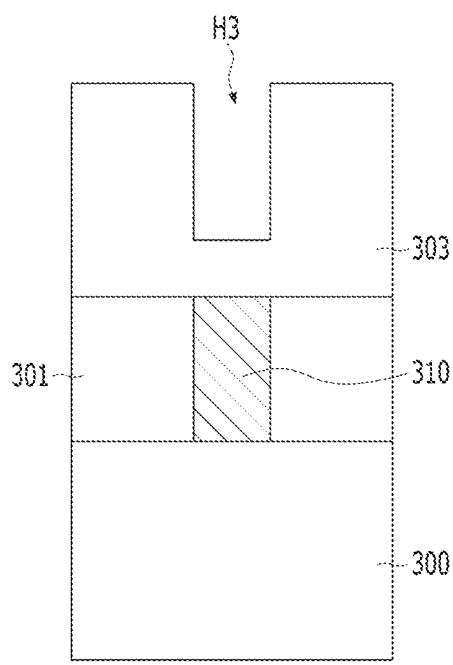

Referring to FIG. 3A, first conductive lines 310 may be formed over a substrate 300 in which a predetermined structure is formed. The first conductive lines 310 may be formed by forming an interlayer dielectric layer 301 having a trench for forming the first conductive lines 310 over the substrate 300, forming a conductive layer for the first conductive lines 310, and etching the conductive layer using a mask pattern in a line shape extending in a first direction.

An interlayer dielectric layer 302 may be formed over the first conductive lines 310 and the interlayer dielectric layer 301. Then, a hole H3 may be formed in the interlayer dielectric layer 302 and a portion of the interlayer dielectric layer 302 below the hole H3 may remain. The remaining portion of the interlayer dielectric layer 302 may have a predetermined thickness. The portion of the interlayer dielectric layer 302 below the hole H3 may be a portion to be converted into a first selector layer (e.g., 321 of FIG. 3B) in a subsequent process. Therefore, when forming the hole H3 in the interlayer dielectric layer 302 by an etch process, the etch process may be performed to a certain depth on the interlayer dielectric layer 302 so that the interlayer dielectric layer 302 may remain under the hole H3 after the etch process. The remaining lower portion of the interlayer dielectric layer 302 may have a predetermined thickness. That is, the etch process for forming the hole H3 in the interlayer dielectric layer 302 may include a low depth (LD) etch process.

Figure 3B:
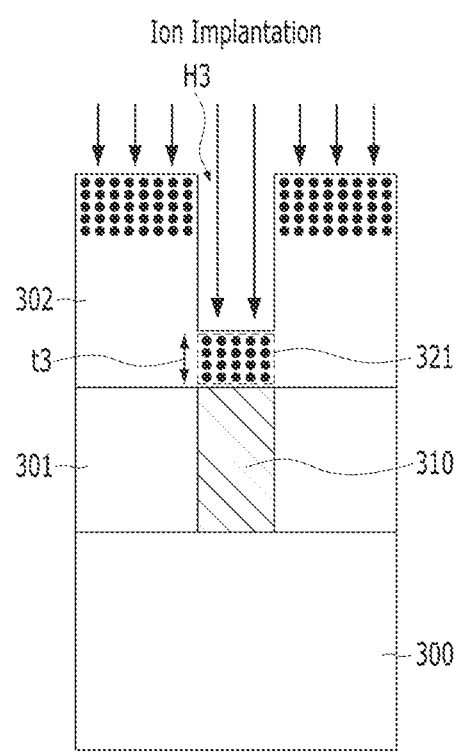

Referring to FIG. 3B, an ion implantation process may be performed on the structure of FIG. 3A. Through the ion implantation process, a dopant may be incorporated into upper portions of the interlayer dielectric layer 302 on both side of the hole H3 and the portion of the interlayer dielectric layer 302 under the hole H3. The portion of the interlayer dielectric layer 302 under the hole H3 may be converted into the first selector layer 321 by incorporating the dopant through the ion implantation process.

Since the first selector layer 321 may be formed without a separate patterning process, an interface between the selector layer 321 and the interlayer dielectric layer 302 may be an interface that is separated depending on the presence or absence of the dopant, not an interface that is physically separated by etching.

Figure 3C:
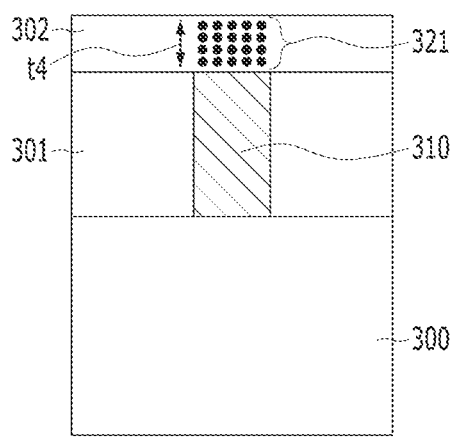

Referring to FIG. 3C, a planarization process such as a CMP (Chemical Mechanical Planarization) process may be performed to remove the doped upper portions of the interlayer dielectric layer 302. Through the planarization process, the H3 and the doped upper portion of the interlayer dielectric layer 302 on both sides of the hole H3 may be removed. After the planarization process, the first selector layer 321 and the interlayer dielectric layer 302 may have upper surfaces at the same level as each other.

A height t4 of the first selector layer 321 may be referred to as a height of the first selector layer 321 after performing of the planarization process, while a height t3 (see, FIG. 3B) of the first selector layer 321 may be referred to as a height of the first selector layer 321 before performing of the planarization process.

In some implementations, the height t4 of the selector layer 321 may be lower than the height t3 of the first selector layer 321.

Figure 3D:
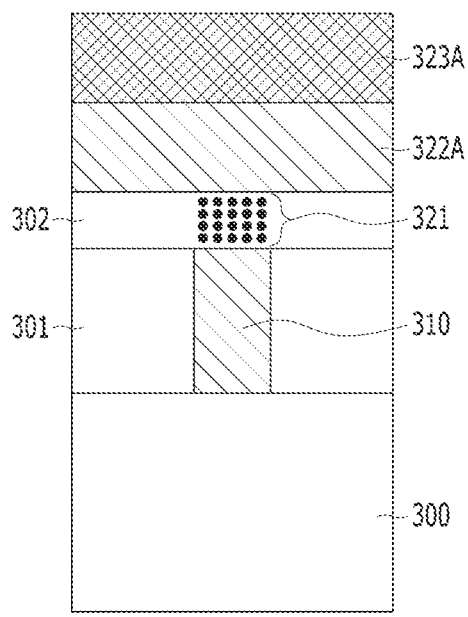

Referring to FIG. 3D, a material layer 322A for a first contact (e.g., 322 of FIG. 3E) and a material layer 323A for a variable resistance layer (e.g., 323 of FIG. 3E) may be sequentially formed on the structure of FIG. 3C.

The material layer 322A may be converted into the first contact 322 by patterning in a subsequent process. The material layer 322A may include a single-layer or multilayer structure including various conductive materials such as a metal, a metal nitride, a conductive carbon material, or a combination thereof.

The material layer 323A may be converted into the variable resistance layer 323 by patterning in a subsequent process.

Figure 3E:
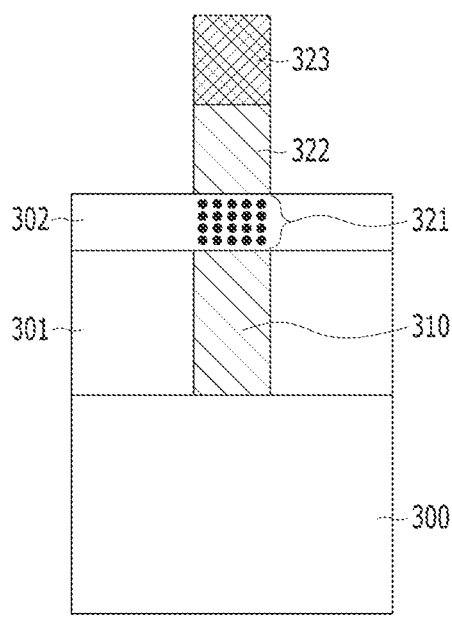

Referring to FIG. 3E, the first contact 322 and the variable resistance layer 323 may be formed by sequentially etching the material layer 323A and the material layer 322A using a mask (not shown).

The first contact 322 may be disposed between the first selector layer 321 and the variable resistance layer 323 and function as a middle electrode to electrically connect the first selector layer 321 and the variable resistance layer 323 to each other while physically separating the first selector layer 321 and the variable resistance layer 323 from each other.

In the implementations, the first contact 322 may be formed between the first selector layer 321 and the variable resistance layer 323. However, in some implementations, the first contact 322 may be omitted. For example, when the buffer layer included in the variable resistance layer 323 may function as a middle electrode, the first contact 322 may be omitted.

Figure 3F:
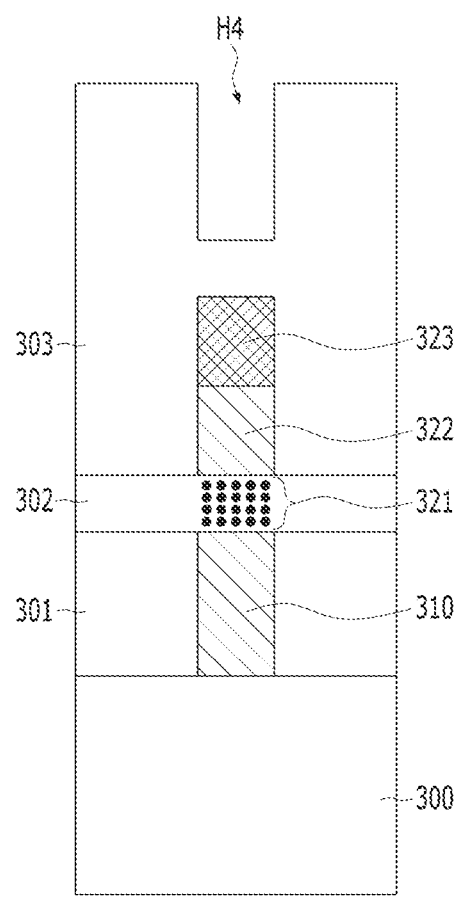

Referring to FIG. 3F, an interlayer dielectric layer 303 may be formed over the structure of FIG. 3E. Then, a hole H4 may be formed in the interlayer dielectric layer 303 and a portion of the interlayer dielectric layer 303 below the hole H4 may remain. The remaining portion of the interlayer dielectric layer 303 may have a predetermined thickness.

The hole H4 may be a space in which a second contact (e.g., 325 of FIG. 3I) is formed in a subsequent process. The portion of the interlayer dielectric layer 303 below the hole H4 may be a portion to be converted into a second selector layer (e.g., 324 of FIG. 3G) in a subsequent process. Therefore, when forming the hole H4 in the interlayer dielectric layer 303 by an etch process, the etch process may be performed to a certain depth on the interlayer dielectric layer 303 so that a lower portion of the interlayer dielectric layer 303 may remain under the hole H4 after the etch process. The remaining lower portion of the interlayer dielectric layer 303 may have a predetermined thickness under the hole H4. That, the etch process for forming the hole H4 in the interlayer dielectric layer 303 may include a low depth (LD) etch.

Referring to FIG. 3G, an ion implantation process may be performed on the structure of FIG. 3F. Through the ion implantation process, a dopant may be incorporated into upper portions of the interlayer dielectric layer 303 on both sides of the hole H4 and the portion of the interlayer dielectric layer 303 under the hole H4. The portion of the interlayer dielectric layer 303 under the hole H4 may be converted into a second selector layer 324 by incorporating the dopant through the ion implantation process.

Since the second selector layer 324 may be performed without a separate patterning process, an interface between the second selector layer 324 and the interlayer dielectric layer 303 may be an interface that is separated depending on the presence or absence of the dopant, not an interface that is physically separated by etching.

The second selector layer 324 and the first selector layer 321 may include the same material as each other.

Figure 3H:
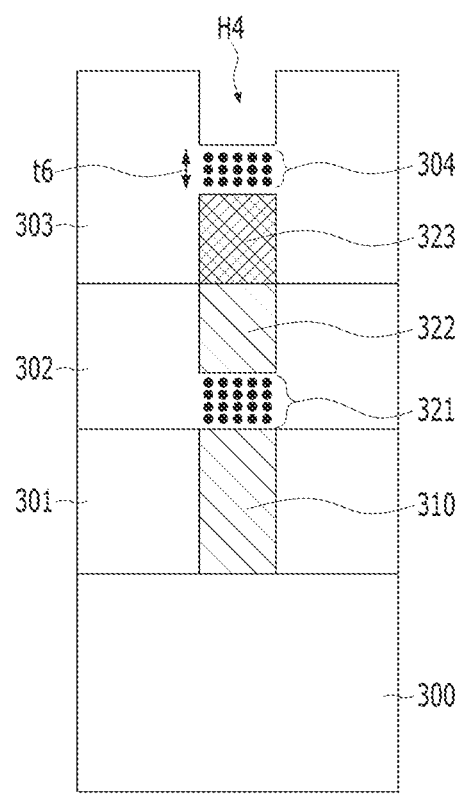

Referring to FIG. 3H, a planarization process such as a chemical mechanical planarization (CMP) process may be performed to remove the doped upper portions of the interlayer dielectric layer 303 on both sides of the hole H2. In this case, a portion of the hole H4 may remain.

In some implementations, a cleaning process may be further performed before and/or after the planarization process.

A height t6 of the second selector layer 324 may be referred to as a height of the second selector layer 324 after performing of the planarization process, while a height t5 (see, FIG. 3G) of the second selector layer 324 may be referred to as a height of the second selector layer 324 before performing of the planarization process.

In some implementations, the height t6 of the second selector layer 324 may be lower than the height t5 of the second selector layer 324.

Figure 3I:
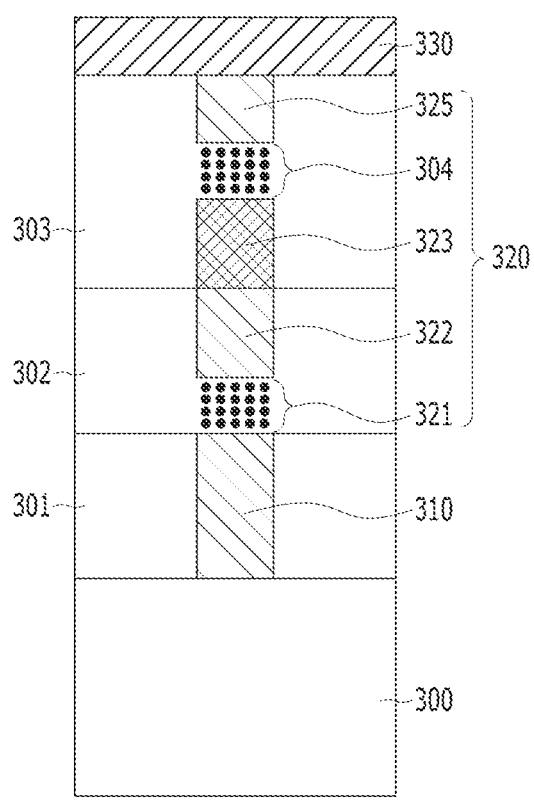

Referring to FIG. 3I, a second contact 225 may be formed in the hole H4. The second contact 325 may be formed by forming a conductive layer for forming the second contact 325 in the hole H4 and performing a planarization process such as a CMP process.

The second contact 325 may include a single-layer or multilayer structure including various conductive materials such as a metal, a metal nitride, a conductive carbon material, or a combination thereof.

Through the above-described processes, a memory cell 320 including the first selector layer 321, the first contact 322, the variable resistance layer 323, the second selector layer 324 and the second contact 325 may be formed.

Second conductive lines 330 may be formed on the second contact 325 and the interlayer dielectric layer 303.

The second conductive lines 330 may be formed by forming a conductive layer for forming the second conductive lines 330 on the second contact 325 and the interlayer dielectric layer 303 and etching the conductive layer using a mask pattern in a line shape extending in a second direction.

The substrate 300, the first conductive lines 310, the first selector layer 321, the first contact 322, the variable resistance layer 323, the second selector layer 324, the second contact 325 and the second conductive lines 330 illustrated in FIG. 3I may correspond to the substrate 100, the first conductive lines 110, the first selector layer 121, the first contact 122, the variable resistance layer 123, the second selector layer 124, the second contact 125 and the second conductive lines 130 illustrated in FIG. 1B, respectively, and the substrate 200, the first conductive lines 210, the first selector layer 221, the first contact 222, the variable resistance layer 223, the second selector layer 224, the second contact 225 and the second conductive lines 230 illustrated in FIG. 2H, respectively.

The semiconductor device formed by the method illustrated in FIGS. 3A to 3I may include the substrate 300, the first conductive lines 310, the memory cell 320 and the second conductive lines 330. The memory cell 320 may include the first selector layer 321, the first contact 222, the variable resistance layer 323, the second selector layer 324 and the second contact 325.

The semiconductor device may include two selector layers, that is, the first selector layer 321 and the second selector layer 324. The first selector layer 321 and the second selector layer 324 may be formed of the same material as each other and may have the same operation characteristic and device operation conditions as each other. In this case, a durability defect rate may be reduced arithmetically by half. Therefore, even if any one of the selector layers 321 and 224 is not operated, it is possible to preserve bit cell operation at a corresponding address.

The semiconductor device includes both the first selector layer 321 and the second selector layer 324. However, the semiconductor device may include any one of the first selector layer 321 and the second selector layer 224.

The semiconductor device includes both the first contact 322 and the second contact 325. However, the semiconductor device may include any one of the first contact 322 and the second contact 325. For example, when the buffer layer 11 included in the variable resistance layer 323 may function as a middle electrode, the first contact 322 may be omitted.

In accordance with the implementations, the first and the second selector layers 321 and 324 may be formed by incorporating the dopant into the interlayer dielectric layer 302 below the first contact 322 and the interlayer dielectric layer 303 below the second contact 325 through the ion implantation processes, instead of forming separate dielectric layers and patterning the dielectric layers. Accordingly, it is possible to prevent etch damage caused by an etch process for forming the selector layers 321 and 324. Further, a sidewall passivation process may be omitted, thereby improving process efficiency.

In the above-described implementations, the selector layers 121, 124, 221 and 224 may be formed by incorporating the dopant into the interlayer dielectric layers 102, 103, 202 and 203 below holes H1, H2, H3 and H4 for forming the contacts 122, 125, 222 and 225, respectively through the ion implantation processes, instead of forming separate dielectric layers for forming the selector layers 121, 124, 221 and 224. However, in some implementations in which a semiconductor device does not include a contact, a selector layer may be formed by forming a dielectric layer and incorporating a dopant into the dielectric layer. This will be described in detail with reference to FIGS. 4A to 4G, and FIGS. 5A to 5G.

FIGS. 4A to 4G are cross-sectional views illustrating another example method for fabricating a semiconductor device based on some implementations of the disclosed technology.

The implementations illustrated in FIGS. 4A to 4G will be described focusing on differences from the implementations illustrated in FIGS. 2A to 2H and FIGS. 3A to 3I.

Figure 4A:
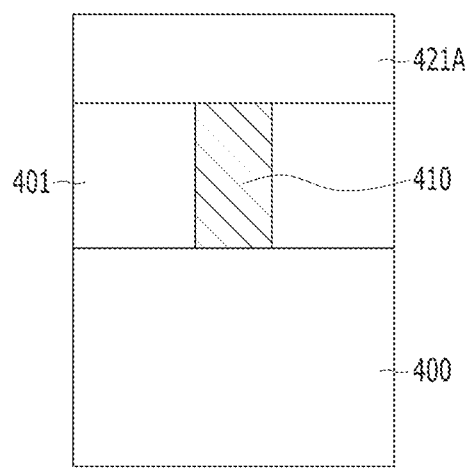
FIGS. 4A to 4G are cross-sectional views illustrating another example method for fabricating a semiconductor device based on some implementations of the disclosed technology.

Referring to FIG. 4A, first conductive lines 410 may be formed over a substrate 400 in which a predetermined structure is formed. The first conductive lines 410 may be formed by forming an interlayer dielectric layer 401 having a trench for forming the first conductive lines 410 over the substrate 400, forming a conductive layer for the first conductive lines 410, and etching the conductive layer using a mask pattern in a line shape extending in a first direction.

A dielectric layer 421A for forming a first selector layer (e.g., 421 of FIG. 4B) may be formed over the first conductive lines 410 and the interlayer dielectric layer 401.

The dielectric layer 421A may include a dielectric material. For example, the dielectric layer 421A may include an oxide, a nitride, an oxynitride, or a combination thereof. Examples of the oxide, the nitride and/or the oxynitride may include silicon oxide, tungsten oxide, titanium oxide, vanadium oxide, chromium oxide, platinum oxide, aluminum oxide, copper oxide, zinc oxide, nickel oxide, cobalt oxide, lead oxide, manganese oxide, niobium oxide, hafnium oxide, silicon nitride, tungsten nitride, titanium nitride, vanadium nitride, chromium nitride, platinum nitride, aluminum nitride, copper nitride, zinc nitride, nickel nitride, cobalt nitride, lead nitride, manganese nitride, niobium nitride, hafnium nitride, silicon oxynitride, tungsten oxynitride, titanium oxynitride, vanadium oxynitride, chromium oxynitride, Platinum oxynitride, aluminum oxynitride, copper oxynitride, zinc oxynitride, nickel oxynitride, cobalt oxynitride, lead oxynitride, manganese oxynitride, niobium oxynitride, or hafnium oxynitride, or a combination thereof.

Figure 4B:
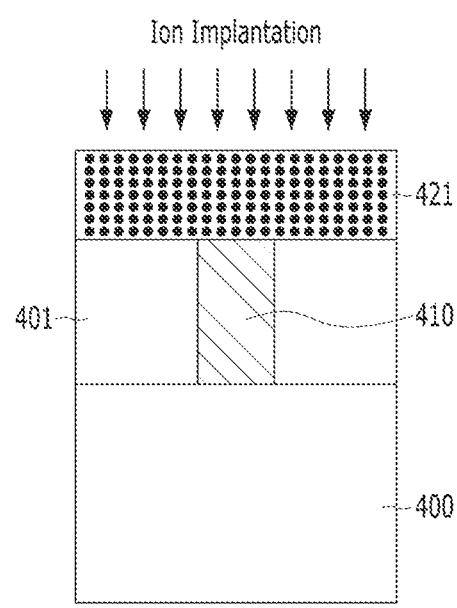

Referring to FIG. 4B, an ion implantation process may be performed on the dielectric layer 421A to incorporate a dopant into the dielectric layer 421A. As a result, a first selector layer 421 may be formed over the first conductive lines 410 and the interlayer dielectric layer 401.

The dopant incorporated by the ion implantation process may include one or more of boron (B), nitrogen (N), carbon (C), phosphorous (P), arsenic (As), aluminum (Al), silicon (Si) and germanium (Ge).

Figure 4C:
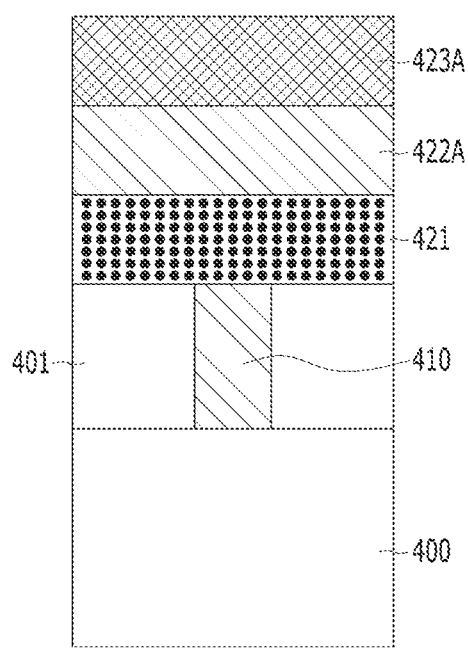

Referring to FIG. 4C, a material layer 422A for a middle electrode layer (e.g., 422 of FIG. 4D) and a material layer 423A for a variable resistance layer (e.g., 423 of FIG. 4D) may be sequentially formed over the first selector layer 421.

The material layer 422A may be converted into the middle electrode layer 422 by patterning in a subsequent process. The material layer 422A may include a single-layer or multilayer structure including various conductive materials such as a metal, a metal nitride, a conductive carbon material, or a combination thereof. For example, the material layer 422A may include tungsten (W), titanium (Ti), tantalum (Ta), platinum (Pt), aluminum (Al), copper (Cu), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The material layer 423A may be converted into the variable resistance layer 423 by patterning in a subsequent process.

Figure 4D:
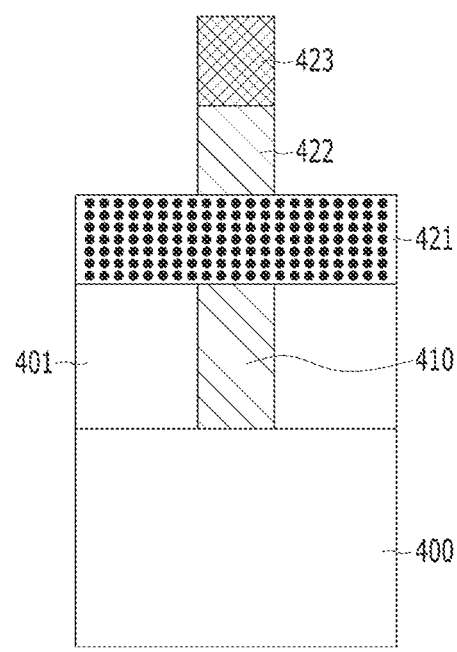

Referring to FIG. 4D, the middle electrode layer 422 and the variable resistance layer 423 may be formed by sequentially etching the material layer 423A and the material layer 422A using a mask (not shown).

The middle electrode layer 422 may be used to electrically connect the first selector layer 421 and the variable resistance layer 423 to each other while physically separating the first selector layer 421 and the variable resistance layer 423 from each other.

In the implementations, the middle electrode layer 422 may be formed between the first selector layer 421 and the variable resistance layer 423. However, in some implementations, the middle electrode layer 422 may be omitted. For example, when the buffer layer included in the variable resistance layer 423 may function as a middle electrode, the middle electrode layer 422 may be omitted.

Figure 4E:
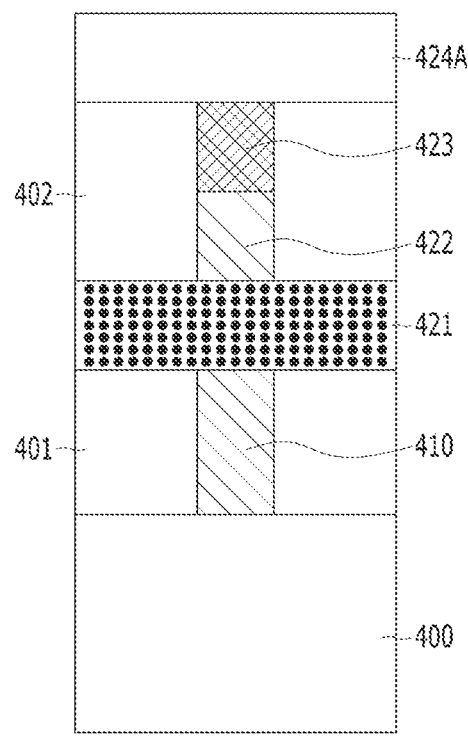

Referring to FIG. 4E, an interlayer dielectric layer 402 may be formed to cover the structure of FIG. 4D and a planarization process may be performed. Then, a dielectric layer 424A for forming a second selector layer (e.g., 424 of FIG. 4F) may be formed over the interlayer dielectric layer 402 and the variable resistance layer 423.

The dielectric layer 424A may include a dielectric material. For example, the dielectric layer 424A may include an oxide, a nitride, an oxynitride, or a combination thereof.

The dielectric layer 424A for forming the second selector layer 424 and the dielectric layer 421A for forming the first selector layer 421 may include the same material as each other.

Figure 4F:
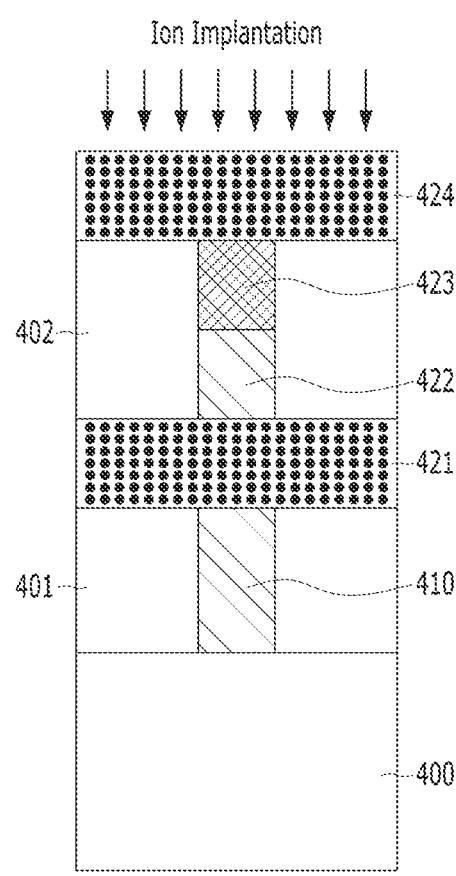

Referring to FIG. 4F, an ion implantation process may be performed on the structure of FIG. 4E. Through the ion implantation process, a dopant may be incorporated into the dielectric layer 424A to form the second selector layer 424. The second selector layer 424 may be formed over the interlayer dielectric layer 402 and the variable resistance layer 423.

The dopant incorporated by the ion implantation process may include one or more of boron (B), nitrogen (N), carbon (C), phosphorous (P), arsenic (As), aluminum (Al), silicon (Si) and germanium (Ge).

The dopant incorporated into the dielectric layer 424A and the dopant incorporated into the dielectric layer 421A may be the same as each other.

The second selector layer 424 and the first selector layer 421 may include the same material as each other.

Through the above-described processes, a memory cell (e.g., 420 of FIG. 4G) including the first selector layer 421, the middle electrode layer 422, the variable resistance layer 423 and the second selector layer 424.

Figure 4G:
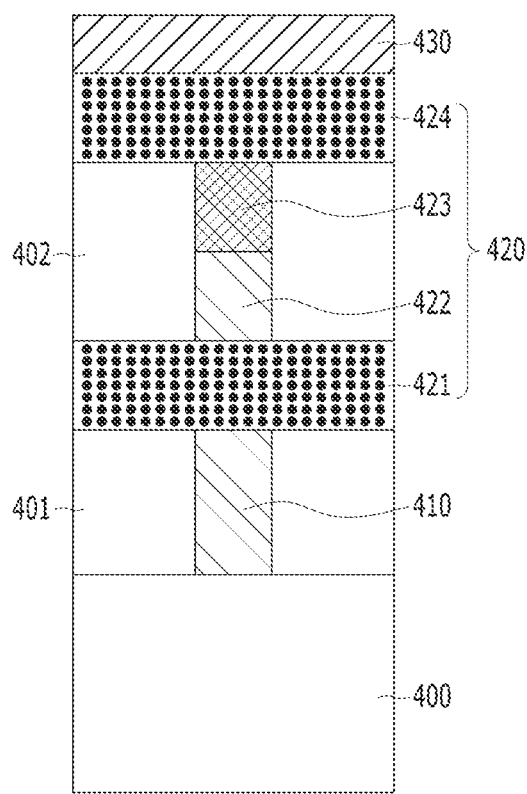

Referring to FIG. 4G, second conductive lines 430 may be formed on the second selector layer 424.

The second conductive lines 430 may be formed by forming a conductive layer for forming the second conductive lines 430 on the second selector layer 424 and etching the conductive layer using a mask pattern in a line shape extending in a second direction.

The semiconductor device illustrated in FIGS. 4A to 4G may include the substrate 400, the first conductive lines 410, the memory cell 420 and the second conductive lines 430. The memory cell 420 may include the first selector layer 421, the middle electrode layer 422, the variable resistance layer 423 and the second selector layer 424.

The first selector layer 421 may be formed above the interlayer dielectric layer 401 and the first conductive lines 410 and below the interlayer dielectric layer 402 and the middle electrode layer 422. The second selector layer 424 may be formed above the interlayer dielectric layer 402 and the variable resistance layer 423 and below the second conductive lines 430.

The first selector layer 421 and the second selector layer 424 may be formed of the same material as each other and have the same operation characteristic and device operation conditions as each other. In this case, a durability defect rate may be reduced arithmetically by half. Therefore, even if any one of the selector layers 421 and 424 is not operated, it is possible to preserve bit cell operation at a corresponding address.

The semiconductor device includes both the first selector layer 421 and the second selector layer 424. However, the semiconductor device may include any one of the first selector layer 421 and the second selector layer 424.

The semiconductor device includes the middle electrode layer 422. However, the semiconductor device may not include middle electrode layer 422. For example, when the buffer layer 11 included in the variable resistance layer 423 may function as a middle electrode, the middle electrode layer 422 may be omitted.

In accordance with the implementations, the first and the second selector layers 421 and 424 may be formed without performing separate patterning processes. Accordingly, it is possible to prevent etch damage caused by an etch process for forming the selector layers 421 and 424. Further, a sidewall passivation process may be omitted, thereby improving process efficiency.

FIGS. 5A to 5G are cross-sectional views illustrating another example method for fabricating a semiconductor device based on some implementations of the disclosed technology.

The implementations illustrated in FIGS. 5A to 5G will be described focusing on differences from the implementations illustrated in FIGS. 2A to 2H, FIGS. 3A to 3I and FIGS. 4A to 4G.

Figure 5A:
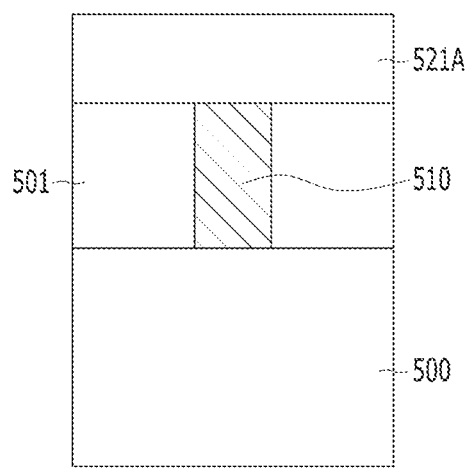
FIGS. 5A to 5G are cross-sectional views illustrating another example method for fabricating a semiconductor device based on some implementations of the disclosed technology.
Figure 5B:
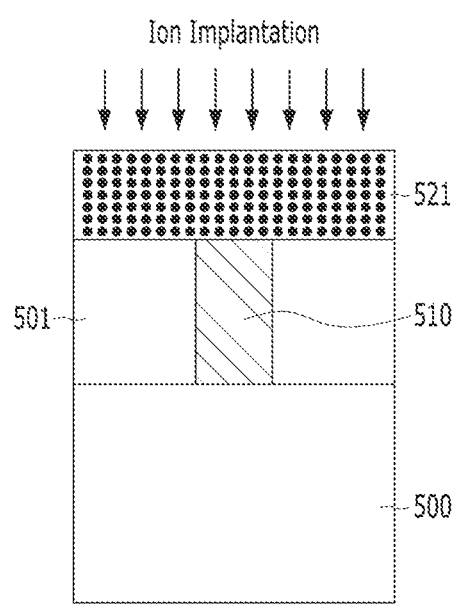
Figure 5C:
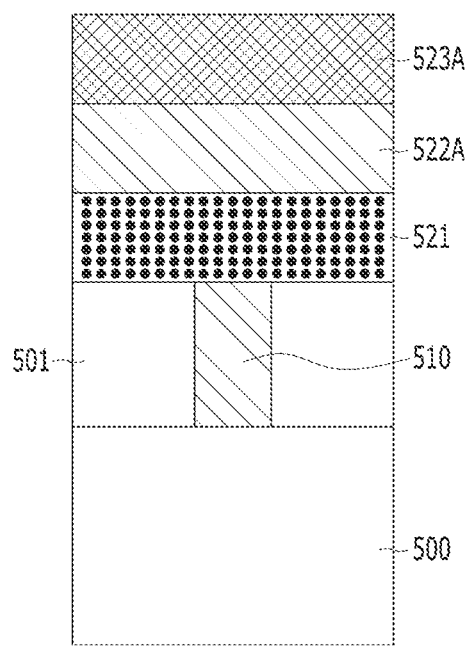

Referring to FIGS. 5A to 5C, an interlayer dielectric layer 501 and first conductive lines 501 may be formed over a substrate 500, and a dielectric layer 521A for forming a first selector layer 521 may be formed over the dielectric layer 521A and the first conductive lines 501 by a method similar to those described in FIGS. 4A to 4C.

An ion implantation process may be performed on the dielectric layer 521A. Through the ion implantation process, a dopant may be incorporated into the dielectric layer 521A to form an initial first selector layer 521B.

A material layer 522A for forming a middle electrode layer (e.g., 522 of FIG. 5D) and a material layer 523A for forming a variable resistance layer (e.g., 523 of FIG. 5D) may be sequentially formed over the initial first selector layer 521B.

Figure 5D:
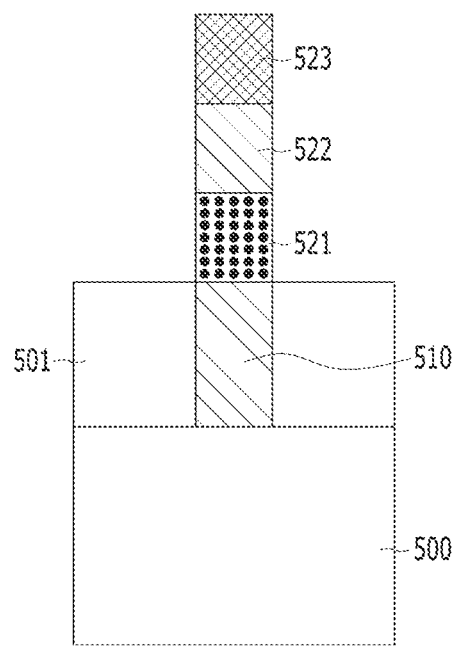

Referring to FIG. 5D, the first selector layer 521, the middle electrode layer 522 and the variable resistance layer 523 may be formed by sequentially etching the material layer 523A, the material layer 522A and the initial first selector layer 521B using a mask (not shown).

Figure 5E:
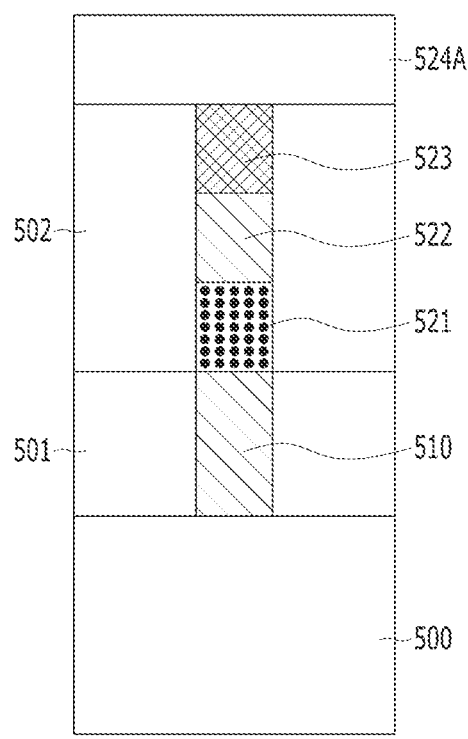

Referring to FIG. 5E, an interlayer dielectric layer 502 may be formed to cover the structure of FIG. 5D and a planarization process may be performed. Then, a dielectric layer 524A for a second selector layer (e.g., 524 of FIG. 5G) may be formed on the interlayer dielectric layer 502 and the variable resistance layer 523.

The dielectric layer 524A for the second selector layer 524 and the dielectric layer 521A for the first selector layer 521 may include the same material as each other.

Figure 5F:
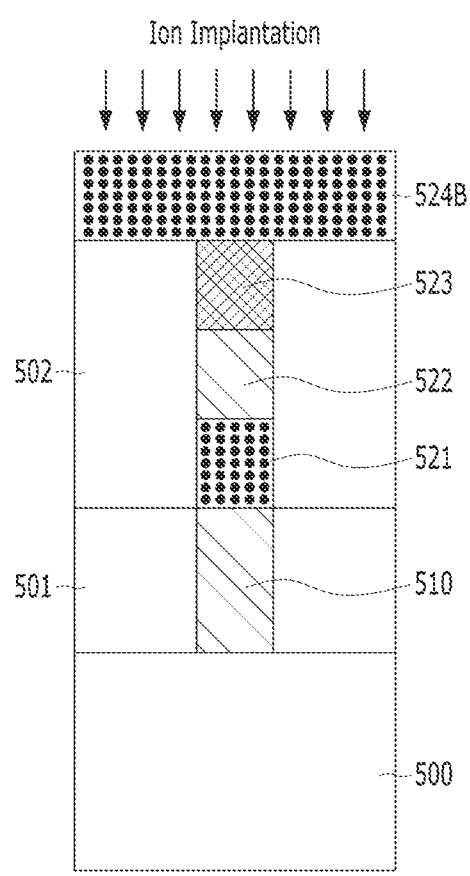

Referring to FIG. 5F, an ion implantation process may be performed on the structure of FIG. 5E. Through the ion implantation process, a dopant may be incorporated into the dielectric layer 524A to form an initial second selection element 524B.

The dopant incorporated into the dielectric layer 524A and the dopant incorporated into the dielectric layer 521A may be the same as each other.

Figure 5G:
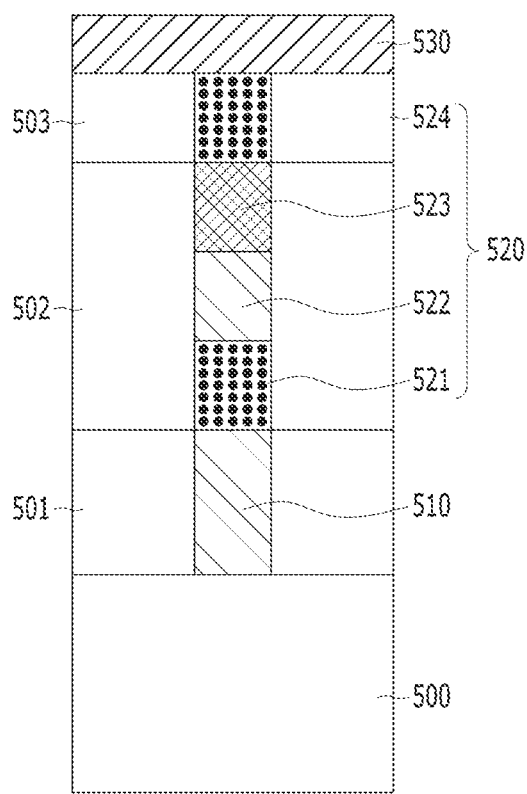

Referring to FIG. 5G, the second selector layer 524 may be formed by etching the initial second selector layer 524B by using a mask (not shown).

The second selector layer 524 and the first selector layer 521 may include the same material as each other.

Through the above-described processes, a memory cell 520 including the first selector layer 521, the middle electrode layer 522, the variable resistance layer 523 and the second selector layer 524 may be formed.

Then, an interlayer dielectric layer 503 may be formed to cover the second selector layer 524 and a planarization process may be performed. Then, second conductive lines 530 may be formed on the second selector layer 524 and the interlayer dielectric layer 503.

The semiconductor device illustrated in FIGS. 5A to 5G may include the substrate 500, the first conductive lines 510, the memory cell 520 and the second conductive lines 530. The memory cell 520 may include the first selector layer 521, the middle electrode layer 522, the variable resistance layer 523 and the second selector layer 524.

The first selector layer 521 may be formed above the first conductive lines 510 and below the middle electrode layer 522. Side walls of the first selector layer 521 may be in contact with the interlayer dielectric layer 502. The second selector layer 524 may be formed above the variable resistance layer 523 and below the second conductive lines 530. Sidewalls of the second selector layer 524 may be in contact with the interlayer dielectric layer 503.

The first selector layer 521 and the second selector layer 524 may be formed of the same material as each other and have the same operation characteristic and device operation conditions as each other. In this case, a durability defect rate may be reduced arithmetically by half. Therefore, even if any one of the selector layers 521 and 524 is not operated, it is possible to preserve bit cell operation at a corresponding address.

The semiconductor device includes both the first selector layer 521 and the second selector layer 524. However, the semiconductor device may include any one of the first selector layer 521 and the second selector layer 524.

The semiconductor device includes the middle electrode layer 522. However, the semiconductor device may not include middle electrode layer 522. For example, when the buffer layer 11 included in the variable resistance layer 523 may function as a middle electrode, the middle electrode layer 522 may be omitted.

The substrate 500, the first conductive lines 510, the middle electrode layer 522 and the variable resistance layer 523 illustrated in FIG. 5G may correspond to the substrate 400, the first conductive lines 410, the first selector layer 421, the middle electrode layer 422, the variable resistance layer 423 and the second selector layer 424 illustrated in FIG. 4G, respectively. The first selector layer 521 and the second selector layer 524 illustrated in FIG. 5G may be formed by an etch process, while the first selector layer 421 and the second selector layer 424 may be formed without performing a patterning process.

While this patent document contains many specifics, these should not be construed as limitations on the scope of any disclosure or of what may be claimed, but rather as descriptions of features that may be specific to particular embodiments of particular disclosures. Certain features that are described in this patent document in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Enhancements and variations of the disclosed embodiments and other embodiments can be made based on what is described and illustrated in this patent document.

What is claimed is:

1. A semiconductor device comprising:
    a plurality of first conductive lines;
    a plurality of second conductive lines disposed over the first conductive lines to be spaced apart from the first conductive line,
    a variable resistance layer disposed above the first conductive line and below the second conductive line;
    at least one of a first interlayer dielectric layer or a second interlayer dielectric layer, wherein the first interlayer dielectric layer includes a first hole disposed between the first conductive line and the variable resistance layer and the second interlayer dielectric layer includes a second hole disposed between the variable resistance layer and the second conductive line;
    at least one of a first contact or a second contact, wherein the first contact is disposed in the first hole and the second contact is disposed in the second hole; and
    at least one of a first selector layer or a second selector layer, wherein the first selector layer is disposed in a portion of the first interlayer dielectric layer below the first contact and the second selector layer is disposed in a portion of the second dielectric layer below the second contact,
    wherein the first selector layer includes a dielectric material of the first interlayer dielectric layer and a dopant, and
    the second selector layer includes a dielectric material of the second interlayer dielectric layer and a dopant.

2. The semiconductor device according to claim 1, wherein each of the first selector layer, the second selector layer, the first interlayer dielectric layer and the second interlayer dielectric layer includes an oxide, a nitride, an oxynitride, or a combination of two or more of the oxide, the nitride, and the oxynitride.

3. The semiconductor device according to claim 1, wherein the dopant includes one or more of boron (B), nitrogen (N), carbon (C), phosphorous (P), arsenic (As), aluminum (Al), silicon (Si) and germanium (Ge).

4. The semiconductor device according to claim 1, wherein the first contact is configured to function as an electrode that electrically connects the first selector layer to the variable resistance layer.

5. The semiconductor device according to claim 1, wherein the first selector layer and the second selector layer include the same dielectric material and the same dopant as each other.

6. The semiconductor device according to claim 1, wherein each of the first contact and the second contact includes a single-layer or multilayer structure including a metal, a metal nitride, or a conductive carbon material, or a combination of two or more of the metal, the metal nitride, and the conductive carbon material.

7. The semiconductor device according to claim 1, wherein the variable resistance layer includes a material having a variable resistance characteristic used for a resistive random access memory (RRAM), a phase change random access memory (PRAM), a ferroelectric random access memory (FRAM) or a magnetic random access memory (MRAM).

8. A semiconductor device comprising:
a plurality of first conductive lines;
a plurality of second conductive lines disposed over the first conductive lines to be spaced apart from the first conductive lines;
a variable resistance layer disposed above the first conductive line and below the second conductive line;
at least one of a first interlayer dielectric layer or a second interlayer dielectric layer, wherein the first interlayer dielectric layer surrounds sidewalls of the first conductive line and the second interlayer dielectric layer surrounds sidewalls of the variable resistance layer; and
at least one of a first selector layer or a second selector layer, wherein the first selector layer is disposed above the first conductive line and the first interlayer dielectric layer and below the variable resistance layer and the second interlayer dielectric layer, and the second selector layer is disposed selector layer above the variable resistance layer and the second interlayer dielectric layer and below the second conductive line.

9. The semiconductor device according to claim 8, wherein each of the first selector layer and the second selector layer includes a dielectric material and a dopant.

10. The semiconductor device according to claim 9 wherein the dielectric material includes an oxide, a nitride, an oxynitride, or a combination of two or more of the oxide, the nitride, and the oxynitride.

11. The semiconductor device according to claim 9, wherein the dopant includes one or more of boron (B), nitrogen (N), carbon (C), phosphorous (P), arsenic (As), aluminum (Al), silicon (Si) and germanium (Ge).

12. The semiconductor device according to claim 8, wherein the first selector layer and the second selector layer include the same dielectric material and the same dopant as each other.

13. The semiconductor device according to claim 8, which does not include an upper electrode contact and a lower electrode contact.

14. The semiconductor device according to claim 8, wherein the variable resistance layer includes a material having a variable resistance characteristic used for a resistive random access memory (RRAM), a phase change random access memory (PRAM), a ferroelectric random access memory (FRAM) or a magnetic random access memory (MRAM).

15. A semiconductor device comprising:
a first conductive line;
a second conductive line disposed over the first conductive line to be spaced apart from the first conductive line;
a variable resistance layer disposed above the first conductive line and below the second conductive line;
a first selector layer disposed between the first conductive line and the variable resistance layer; and
a second selector layer disposed between the variable resistance layer and the second conductive line,
wherein each of the first selector layer and the second selector layer includes a dielectric material and a dopant.

16. The semiconductor device according to claim 15, the dielectric material includes an oxide, a nitride, an oxynitride, or a combination of two or more of the oxide, the nitride, and the oxynitride.

17. The semiconductor device according to claim 15, wherein the dopant includes one or more of boron (B), nitrogen (N), carbon (C), phosphorous (P), arsenic (As), aluminum (Al), silicon (Si) and germanium (Ge).

18. The semiconductor device according to claim 15, wherein the first selector layer and the second selector layer include the same dielectric material and the same dopant as each other.

19. The semiconductor device according to claim 15, wherein the semiconductor device does not include an upper electrode contact and a lower electrode contact.

20. The semiconductor device according to claim 15, wherein the variable resistance layer includes a material having a variable resistance characteristic used for a resistive random access memory (RRAM), a phase change random access memory (PRAM), a ferroelectric random access memory (FRAM) or a magnetic random access memory (MRAM).

21. A method for fabricating a semiconductor device comprising:
forming a first conductive line over a substrate;
forming a second conductive line over the first conductive line to be spaced apart from the first conductive line;
forming a variable resistance layer above the first conductive line and below the second conductive line;
forming an interlayer dielectric layer including a hole between the first conductive line and the variable resistance layer, between the variable resistance layer and the second conductive line, or both between the first conductive line and the variable resistance layer and between the variable resistance layer and the second conductive line; and
performing an ion implantation of a dopant into a portion of the interlayer dielectric layer below the hole and upper portions of the interlayer dielectric layer on both sides of the hole to convert the portion of the interlayer dielectric layer below the hole into a selector layer.

22. The method according to claim 21, wherein each of the selector layer and the interlayer dielectric layer includes an oxide, a nitride, an oxynitride, or a combination of two or more of the oxide, the nitride, and the oxynitride.

23. The method according to claim 21, wherein the dopant includes one or more of boron (B), nitrogen (N), carbon (C), phosphorous (P), arsenic (As), aluminum (Al), silicon (Si) and germanium (Ge).

24. The method according to claim 21, further comprising, after the performing of the ion implantation process, performing a planarization process to remove the upper portions of the interlayer dielectric layer on both sides of the hole in which the dopant is implanted.

25. The method according to claim 24, further comprising, after the performing of the planarization process, forming a contact in the hole.

26. The method according to claim 25, wherein the contact is configured to function as an electrode that electrically connects the selector layer to the variable resistance layer.

27. The method according to claim 21, further comprising, after the performing of the ion implantation process, performing a planarization process to expose a bottom surface of the hole so that upper surfaces of the selector layer and the interlayer dielectric layer are positioned at the same level as each other.

28. The method according to claim 27, further comprising:
   forming a material layer for forming an electrode layer on the selector layer and the interlayer dielectric layer; and
   forming an electrode layer by etching the material layer using a mask pattern.

29. The method according to claim 21, wherein, in a case that the semiconductor device includes two selector layers, each of the selector layers includes the same material as each other.

30. The method according to claim 21, wherein the variable resistance layer includes a material having a variable resistance characteristic used for a resistive random access memory (RRAM), a phase change random access memory (PRAM), a ferroelectric random access memory (FRAM) or a magnetic random access memory (MRAM).

31. A method for fabricating a semiconductor device comprising:
   forming a first conductive line over a substrate;
   forming a second conductive line over the first conductive line to be spaced apart from the first conductive line;
   forming a variable resistance layer between the first conductive line and the second conductive line;
   forming at least one of a first interlayer dielectric layer or a second interlayer dielectric layer, wherein the first interlayer dielectric layer surrounds sidewalls of the first conductive line and the second interlayer dielectric layer surrounds sidewalls of the variable resistance layer;
   forming at least one of a first dielectric layer or a second dielectric layer, wherein the first dielectric layer is disposed above the first conductive line and the first interlayer dielectric layer and below the variable resistance layer and the second interlayer dielectric layer, and the second dielectric layer is disposed above the variable resistance layer and the second interlayer dielectric layer and below the second conductive line; and
   performing an ion implantation process on at least one of the first dielectric layer or the second dielectric layer to form at least one of a first selector layer or a second selector layer, wherein the first selector layer is disposed above the first conductive line and the first interlayer dielectric layer and below the variable resistance layer and the second interlayer dielectric layer and the second selector layer is disposed above the variable resistance layer and the second interlayer dielectric layer and below the second conductive line, and the first selector layer and the second selector layer include a dielectric material and a dopant, respectively.

32. The method according to claim 31, wherein the dielectric material includes an oxide, a nitride, an oxynitride, or a combination of two or more of the oxide, the nitride, and the oxynitride.

33. The method according to claim 31, wherein the dopant includes one or more of boron (B), nitrogen (N), carbon (C), phosphorous (P), arsenic (As), aluminum (Al), silicon (Si) and germanium (Ge).

34. The method according to claim 31, further comprising, after the performing of the ion implantation process, performing a planarization process.

35. The method according to claim 31, further comprising, after the forming of the first selector layer,
   forming a material layer for forming the variable resistance layer on the first selector layer; and
   forming the variable resistance layer by etching the material layers.

36. The method according to claim 31, further comprising, after the forming of the first selector layer,
   forming a material layer for forming an electrode layer on the first selector layer;
   forming a material layer for forming the variable resistance layer on the material layer for forming the electrode layer; and
   forming the electrode layer and the variable resistance layer by sequentially etching the material layer for forming the variable resistance layer and the material layer for forming the electrode layer using a mask pattern.

37. The method according to claim 31, further comprising, after the forming of the first selector layer,
   forming a material layer for forming the variable resistance layer on the first selector layer; and
   forming the variable resistance layer and a patterned selector layer by etching the material layer for forming the variable resistance layer and the first selector layer using a mask pattern.

38. The method according to claim 31, further comprising, after the forming of the first selector layer,
   forming a material layer for forming an electrode layer on the first selector layer;
   forming a material layer for forming the variable resistance layer on the material layer for forming the electrode layer; and
   forming the variable resistance layer, the electrode layer and a patterned selector layer by etching the material layer for forming the variable resistance layer, the material layer for the electrode layer and the first selector layer through a patterning process.

39. The method according to claim 31, further comprising, after the forming of the second selector layer,
   forming a patterned selector layer by etching the second selector layer using a mask pattern.

40. The method according to claim 31, wherein the semiconductor device does not include an upper electrode contact and a lower electrode contact.

41. The method according to claim 31, wherein the variable resistance layer includes a material having a variable resistance characteristic used for a resistive random access memory (RRAM), a phase change random access memory (PRAM), a ferroelectric random access memory (FRAM) or a magnetic random access memory (MRAM).

* * * * *